United States Patent
Varshney et al.

(10) Patent No.: US 7,284,212 B2
(45) Date of Patent: Oct. 16, 2007

(54) MINIMIZING COMPUTATIONAL COMPLEXITY IN CELL-LEVEL NOISE CHARACTERIZATION

(75) Inventors: Gaurav Kumar Varshney, Aligarh (IN); Sreeram Chandrasekar, Bangalore (IN)

(73) Assignee: Texas Instruments Incorporated, Dallas, TX (US)

(*) Notice: Subject to any disclaimer, the term of this patent is extended or adjusted under 35 U.S.C. 154(b) by 212 days.

(21) Appl. No.: 10/710,509

(22) Filed: Jul. 16, 2004

(65) Prior Publication Data

US 2006/0015831 A1 Jan. 19, 2006

(51) Int. Cl.
*G06F 17/50* (2006.01)

(52) U.S. Cl. .................. 716/4; 716/5; 716/6; 703/14
(58) Field of Classification Search ............ 716/4–6; 703/14
See application file for complete search history.

(56) References Cited

U.S. PATENT DOCUMENTS

| | | | |
|---|---|---|---|
| 5,818,264 A * | 10/1998 | Ciraula et al. ............. 326/98 |
| 6,493,853 B1 | 12/2002 | Savithri et al. | |
| 6,499,129 B1 | 12/2002 | Srinivasan et al. | |
| 6,499,131 B1 * | 12/2002 | Savithri et al. ............. 716/5 |
| 6,675,118 B2 | 1/2004 | Wanek et al. | |
| 6,732,339 B2 | 5/2004 | Savithri et al. | |
| 6,836,873 B1 * | 12/2004 | Tseng et al. ............... 716/4 |
| 7,007,252 B2 * | 2/2006 | Gyure et al. ............... 716/5 |
| 2003/0115557 A1 * | 6/2003 | Elzinga ..................... 716/4 |
| 2003/0145296 A1 * | 7/2003 | Chandra et al. ........... 716/6 |
| 2004/0015339 A1 * | 1/2004 | Wu et al. ................ 703/14 |

* cited by examiner

*Primary Examiner*—Thuan Do
*Assistant Examiner*—Naum B. Levin
(74) *Attorney, Agent, or Firm*—Alan K. Stewart; W. James Brady; Frederick J. Telecky, Jr.

(57) ABSTRACT

Reducing the number of computations required to pre-characterize cells in a cell-library. In an embodiment, a worst case vector which propagates most noise on an arc (combination of input pin and output pin) of a cell is determined, and NP characteristics and NIC are generated only for the worst case vector. Noise analysis is then performed using such curves generated from the worst case vector. Since curves corresponding to only the worst case vector may need to be generated, the computational requirements may be reduced. The search ranges in determining the immunity transition points forming the NIC may be reduced, according to some aspects of the present invention. The data corresponding to NIC may be used to generate NP curves, and vice versa to reduce computational requirements further.

26 Claims, 16 Drawing Sheets

MINIMIZING COMPUTATIONAL COMPLEXITY IN CELL-LEVEL NOISE CHARACTERIZATION

BACKGROUND OF INVENTION

1. Field of the Invention

The present invention relates to computer aided design (CAD) methodologies used to implement integrated circuits, and more specifically to a method and apparatus to reduce computational complexity in characterization of various parameters representing cross-talk noise of cells in a library used in designing integrated circuits.

2. Related Art

Libraries are often used in designing integrated circuits (ICs). In general, a library contains multiple cells (e.g., logic gates, multiplexers, etc.), and a designer selects and includes a desired cell in a circuit design. Several libraries are often provided, each being designed for a corresponding combination of manufacturing process, temperature, voltage (PTV), etc.

Page of Cells are often characterized prior to being used in the design on ICs. Characterization generally refers to the determination of various electrical parameters of interest for each cell. Such pre-determination enables a system (typically, using which an IC is being designed) to quickly analyze a proposed design for conformance with various criteria (e.g., design rules, timing constraints) as a designer designs a desired circuit.

Cross-talk noise among nets connecting cells is often of concern in the design of ICs, particularly in deep submicron technologies. Cross-talk noise generally refers to interference caused by some nets (aggressor) on other nets (victims). Of particular concern in IC designs is crosstalk noise induced due to parasitic coupling. Such induced noise or glitches could cause functional failure by switching logic_ states. In the case of designs employing dynamic logic design styles, this problem is more severe due to increased noise sensitivities of pre_charged nodes.

By analyzing a (proposed) circuit for the effects of such cross-talk noise, one may ensure that a later fabricated circuit would operate in a desired manner even in the presence of cross-talk noise. At least for such a reason, it is generally desirable that cells in a library be characterized to determine various related parameters ("noise parameters").

One noise parameter of interest is 'noise immunity'. Noise immunity parameters generally indicate whether a glitch of a given width and/or height on an input pin of a cell would cause the signal at an output pin (and thus the connected nets) to be altered by more than a pre-specified threshold (and/or a change of state in the case of sequential elements). Often a noise immunity curve (NIC) is generated which indicates the minimum height of an input glitch that would cause an output glitch exceeding a pre-specified threshold level/height for a given width of an input glitch.

Another noise parameter of interest is 'noise propagation' (NP), which specifies the characteristics of an output glitch in response to a input glitch of a given height and width. NP curves (commonly referred to as NP characteristics) are often drawn mapping the height (peak) of the input glitch to the height of the output glitch. The NP curves would indicate the effect of an input glitch (on one cell) on the subsequent cells connected to the output net of the cell.

The characterized NIC and NP curves are used to quickly determine failures in response to input glitches in integrated circuits. For example, in static noise analysis (SNA), the NP characteristics/curves and NICs are used to determine the effect of aggressor nets on victim nets. Often the analysis is performed without regard to the states of the input pins generally because the probability that the states of all pins will be known is low. The results of the analysis are used as a basis to determine which nets need to be redesigned. By pre-characterizing the curves, such analysis may be performed quickly.

The need for such characterization is increasing with improvements (e.g., from 130 nanometer process technology to 90 nanometer process technology) in fabrication technologies, which are enabling packing of more transistors into the same area. It has been observed that the coupling capacitance contributes to a greater degree (as a fraction of the total capacitance on a net) with such improvements. Accordingly, an increasing need is believed to be presented to characterize the related noise parameters.

One general requirement in characterization of cells for the noise parameters often is to reduce the computational requirement. Often due to a large number of cells in each library and/or a large number of libraries (e.g., to correspond to different PVT combinations), it may take several days or weeks to characterize the noise parameters of the cells in cell libraries. By decreasing such total characterization time, the total time to design an IC as well as cost for characterization, can be reduced.

What is therefore needed is a method and apparatus to reduce computational complexity in characterization of various parameters representing the effect of cross-talk noise on cells in a library used in designing integrated circuits.

BRIEF SUMMARY OF THE INVENTION

The method reduces computational resources in characterizing a parameter for a combination of an input pin and an output pin of a cell, the cell being contained in a library used in the design of an integrated circuit. The method includes: determining a worst case vector, wherein the worst case vector represents a set of input bits, with each of the input bits being applied to a corresponding one of a set of input pins wherein the corresponding one is other than the input pin of the combination, wherein the worst case vector would cause propagation of most noise from the input pin to the output pin among vectors which would cause a bit value transition on the output pin if the input bit value is changed on the input pin; computing a plurality of data values for the parameter when the worst case vector is applied to the set of input pins, wherein the plurality of data values are used in an analysis of the integrated circuit irrespective of which of the vectors is applied to the set of input pins; and wherein the parameter comprises noise immunity, wherein a failure result is deemed to be obtained for an input glitch of a first height and a first width if the height of an output glitch corresponding to the input glitch exceeds a first threshold voltage, and a success result is deemed to be obtained otherwise, the method further includes generating a noise immunity curve (NIC) corresponding to only the worst case vector, wherein the NIC contains a plurality of immunity transition points, wherein each of the plurality of immunity transition points indicates a minimum value for one dimension of the input glitch required for the failure result for each of a value of the other dimension.

BRIEF DESCRIPTION OF DRAWINGS

The present invention will be described with reference to the following accompanying drawings.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

I. Overview

Figure 1A:
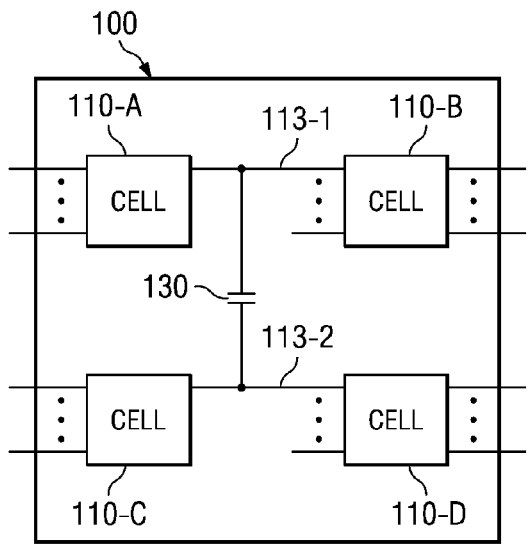
FIG. 1A is a block diagram of an example circuit used to illustrate several aspects of the present invention.

An aspect of the present invention enables reduction of computational resources in characterizing parameters representing cross_talk noise of cells in a library by first determining a worst case vector for an input pin and output pin combination (commonly referred to as an arc), which would propagate most noise from the input pin to the output pin among all the vectors of interest. A vector of interest for an input pin and output pin combination represents an input bits combination for other input pins, which would cause a bit value transition on the output pin if the input bit value is changed on the input pin.

An integrated circuit designed using the cell library is then analyzed using the parameters data related to the worst case vectors. Thus, when a cell is analyzed while receiving other (non-worst case) vectors, the parameters data may indicate that more noise is propagated to the output than that would be actually propagated. However, the actual vectors are generally not known in situations such as static noise analysis (SNA) and using worst case vector ensures acceptable noise in the operation of an IC for other vectors. Therefore, at least in SNA type situations, reduced computational requirements are obtained, in addition to using a desirable vector for noise analysis.

In one embodiment, the parameters thus characterized include noise propagation (NP) data (characteristics) and noise immunity data/curve. The noise immunity data indicates whether an input glitch of a given height and a given would cause an output glitch exceeding a pre-specified threshold (e.g., 10 percent of Vdd), in which case the result is deemed to be a failure (generally requiring redesign of the corresponding input net) and a success otherwise. A noise immunity curve (NIC) may be generated from the noise immunity data, with the NIC mapping an width and height combination (of an input glitch) to a success or failure result, thereby enabling the analysis of an IC to be performed quickly later. Each point on the NIC may be referred to as a immunity transition point. A NIC may be generated only for the worst case vector in an embodiment to reduce computational requirements.

The NP data on the other hand indicates the height and width of an output glitch in response to an input glitch of a specified height and width. A NP curve may be generated for each width of interest. Each NP curve indicates the corresponding height of an output glitch in response to an input glitch of a given height. The NP data may also be generated based on only the worst case vector (for a given arc of a cell). As a result, the computational requirements for characterization of a cell library may be reduced, as noted above.

Further reduction in computational requirements for determining NP parameters and noise immunity parameters may be achieved, as described below with examples.

With respect to determining immunity transition point on a NIC, in general, a search range (with upper bound and lower bounds for height, while fixing width) is first defined and simulations are performed within the search range to predict the boundary point of the failure area and success area for a NIC. Various aspects of the present invention enable the search range to be narrowly defined, thereby reducing the number of simulations as described below.

According to an aspect of the present invention, the search range is reduced by fitting pre-determined immunity transition points into a curve and predicting the height of the immunity transition point sought to be determined. The upper and lower bounds are respectively set to equal more and less than the predicted height by a specific value (e.g., 15 points of the resolution of the search), and the range may be searched to determine the exact height of the immunity transition point. Due to the predicted height and thus reduced search range, the number of simulations may be reduced.

According to another aspect of the present invention, two input glitches of the same width but of heights separated by a step size of the NP curve/data are determined such that one input glitch provides a failure result and another glitch provides a success result. The two input glitches may be advantageously determined while generating NP data, and thus may not require additional computations. The search range would contain the (height corresponding to) immunity transition point due to the use of the NP data. The number of simulations may be reduced as a result.

According to one more aspect of the present invention, if multiple immunity transition points are already known, the points may be fitted into a curve and the height of the immunity transition point sought to be determined is predicted (for a given width) by appropriate mapping on to the curve. The heights corresponding to the two adjacent (one for narrower width and another for wider width) points (i.e., immunity transition points already determined) used as the bounds for the search range. As the search range would accurately contain the immunity transition point sought to be determined, the number of simulations can be reduced.

The overlap of the search ranges noted above can be advantageously used to further reduce the search range.

The computational resource requirements for NP curves may also be reduced by that the height of the output glitches for corresponding height of the input glitches would remain substantially same outside of a transition region due to either no glitch propagation or causing a definite transition at the output pin search may be performed to identify the boundaries of the transition region, and the height corresponding to the boundary points may be used to set the values of the points outside of the transition region. Computational requirements are reduced as a result.

Another aspect of the present invention enables the start search point to be reliably placed in the transition region. Assuming a NIC is either available or plotted (using curve fitting), the height corresponding to the width for which the NIC relates to, is determined from the NIC, and the start point of the NP curve is set based on the determined height. Since NIC by definition provides (output glitch) height of a pre-specified percentage of the maximum possible height, the determined height may reliably fall in the transition region, thereby reducing the computational requirements further.

One more aspect of the present invention reduces the computational requirements by interleaving the computation of noise immunity data and NP data. In an embodiment, the NP curves corresponding to the widest and narrowest widths of input glitches are determined first. The immunity transition points for the two widths are then determined using the NP data to reduce the search range, as described above. A third NP curve may then be determined corresponding to an intermediate (middle) width. The average of the heights corresponding to the two determined immunity transition points may be used as a start point for the third NP curve.

The data from the third NP curve may then be used to determine the corresponding (of the same width) immunity transition point. The three immunity transition points may be used to generate an approximate NIC by using curve fitting techniques. The curve thus generated is then used to set the start points for the remaining NP curves. The NP curves in turn are used in generating the immunity transition points, and thus the accurate NIC. The determination of NP curves and immunity transition points for the same width can be interleaved for increasing the accuracy of various predictions, and thus reducing the computational resource requirements.

More aspects of the present invention reduce computational requirements in noise immunity characterization of sequential cells. In general, it needs to be known whether input glitches of various heights and width would either cause a transition (a change of state) on the output pin or cause an output glitch to exceed a pre-specified threshold, in which case a failure result is deemed to be obtained. Otherwise, a success/pass result is deemed to be obtained. For each input width and height combination, the clock may need to be swept in a range (exceeding the width), and such sweep requires multiple simulations with the clock transition point being placed at various places in relation to the data transition time.

An aspect of the present invention determines whether the sweep (and corresponding simulations) can be avoided by simulating each cell of interest with an input transition waveform having a height equaling the height of an input glitch of interest and providing infinite (i.e., sufficient time for any practical sequential element to latch) setup and hold times. If the result of the simulation indicates a success result (i.e., not sufficient noise propagated), sweep can be avoided for all widths of the input glitch for the same height. Thus, the computational requirements can be reduced.

The computational requirements for characterization of sequential cells can be further reduced by using the various techniques which use other immunity transition points already determined, to reduce the search range of a height of the glitch.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well_known structures or operations are not shown in detail to avoid obscuring the invention.

II. Example Circuit

FIG. 1A is a block diagram of an example circuit used to illustrate several aspects of the present invention. Circuit 100 is shown containing cells 110-A through 110-D and capacitor 130. Cell 110-A is shown connected to cell 110-B by net 113-1, and cell 110-C is shown connected by net 113-2.

Capacitor 130 represents a coupling capacitance between nets 113-1 and 113-2 and signal transitions on one net can cause a glitch on another net due to coupling through capacitor 130. For illustration, in the below description, it is assumed that 113-1 is the aggressor net and 113-2 is the victim net. The potential effect on the cell(s) connected to the victim net may be measured by 'noise immunity' and 'noise propagation' parameters noted above. Various aspects of the present invention reduce the computational requirements in characterizing the parameters as described below in further detail.

III. Noise Immunity Parameters

III. A. General Introduction

As noted above, noise immunity parameters generally indicate whether a glitch of a given width and/or height on a pin would cause the signal at an output pin of a cell to be altered by more than a pre-specified threshold. In general, a glitch at the input pin has to be greater than a certain fixed voltage to cause a failure (i.e., response on the output pin exceeds a pre-specified threshold). However, a glitch with a large height may still not cause any failure, if the glitch width is very small. This is mainly because noise failure is related to input noise glitch energy and this energy is proportional to the area under the glitch waveform.

Figure 1B:
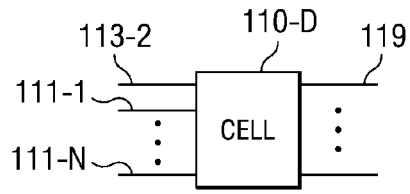
FIG. 1B is a diagram of a cell illustrating various input pins and output pins.

In addition, the output response of a cell might be different for different values for the input pins of the cell. For example, with reference to FIG. 1B, cell 110-D is shown with input pins 113-2 and 111-1 through 111-N, and it may be desirable to ensure that pin 113-2 (as impacted by pin 113-1) is immune to noise for any combination of the N-bit values which would cause the bit value on output pin 119 to change if a logical value on pin 113-2 is changed. Each such N-bit value, which would cause the bit value on output pin 119 to change, may be termed as a vector. Thus, the output response may be different for different vectors.

Figure 2A:
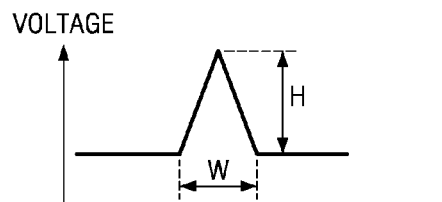
FIG. 2A is a timing diagram of an example glitch representing cross-talk noise.
Figure 2B:
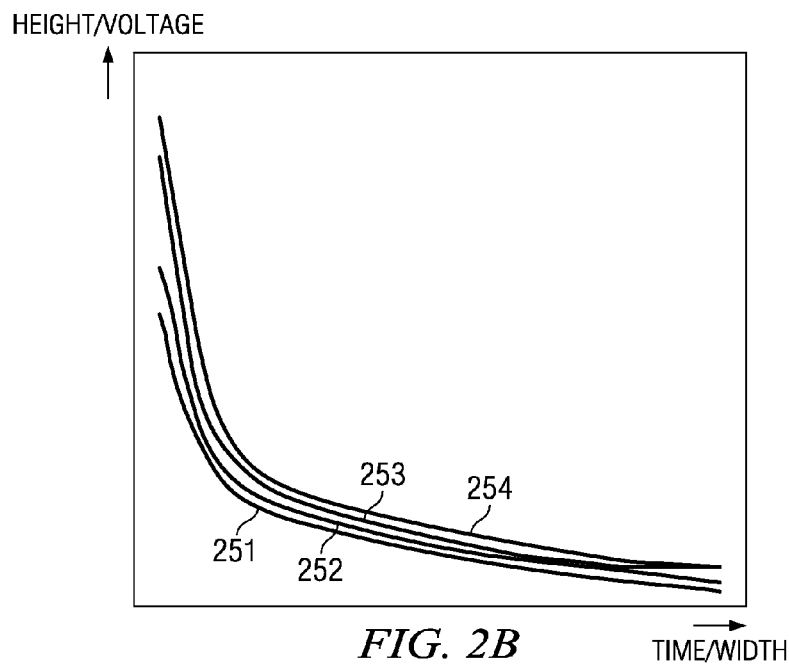
FIG. 2B is a timing diagram illustrating noise immunity curves of a full adder.

Accordingly, in one prior approach, a noise immunity graph may be generated by applying a glitch of shape shown in FIG. 2A, and generating the noise immunity curves (NIC) shown in FIG. 2B for the corresponding vectors. With respect to FIG. 2A, the glitch is shown with a height (voltage) H and width (time) W. FIG. 2A is shown containing a rising glitch for illustration and the description is provided substantially with respect to rising glitches only for conciseness. However, similar characterization is generally performed with reference to falling glitches as well. The height and width of a glitch can be varied to generate the curves of FIG. 2B as described below.

With reference to FIG. 2B, the X-axis represents width (W) and Y-axis the height (H). In an embodiment, the Y-axis contains a range from 0 to twice the Vdd value, wherein Vdd represents the supply voltage. The range of values of interest on the X-axis may be determined based on typical values expected from design/implementation considerations, and are provided as inputs for characterization. Curves 251-254 represent the immunity curves corresponding to four vectors.

Figure 2C:
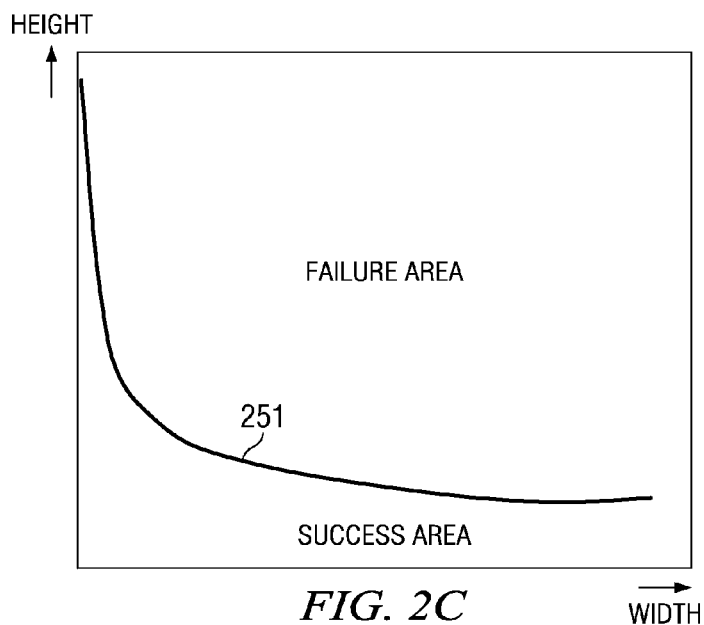
FIG. 2C is a timing diagram illustrating the failure area and success area in relation to a noise immunity curve.

Each immunity curve separates the points of failure (i.e., the input glitches which would cause the output glitch to exceed a pre-specified threshold level) and the points where there are no failures. The points containing all the failure points may be viewed as being contained in a 'failure area', and the points where there is no failure may be viewed as being contained in a 'safe/success area'. The points in the boundary between the two areas may be referred to as immunity transition points. Thus, each immunity curve is defined by the corresponding immunity transition points. With reference to curve 251 of FIG. 2C, all the points above curve 251 represent failure area, all the points below curve 251 represent success area and all the points on curve 251 represent immunity transition points.

Figure 3:
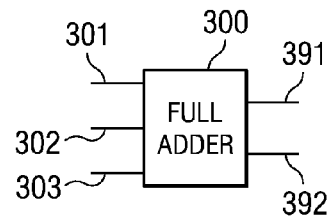
FIG. 3 is a block diagram illustrating various inputs and outputs of a full adder.

For illustration, it is assumed that the cell sought to be characterized represents full adder 300, having three inputs (301-303) and two outputs (sum 391 and carry 392) as shown in FIG. 3. It is assumed that an arc between input pin 301 and output pin 391 (carrying the sum result) is considered for characterization. For an arc between inputs and sum 391, four vectors would present, which correspond to the four values 00, 01, 10, and 11 on pins 302 and 303 respectively. Curves 251-254 represent the immunity curves corresponding to the four vectors.

Thus, in a prior approach, the immunity transition points on each curve are determined by first fixing an input vector and one of height and width, and varying the other one of height/width using binary search techniques until the boundary of safe area and failure area is determined with a desired accuracy. If the height of the output glitch exceeds the pre-specified threshold, a 'failure result' is said to be obtained, and a 'success result' is said to be obtained otherwise. Thus, the immunity transition point is found when adjacent input glitches differing by the desired accuracy produce different results.

Each point on the NIC may be thus determined for a given vector. The technique may be repeated for each curve. Once the curves are determined, analysis can be quickly performed to determine any potential failures in chip level noise analysis. It may be appreciated that substantial computational resources may be consumed in determining the points on all the curves.

For example, assuming that the maximum input glitch height is 2*Vdd and NIC needs to be measured to an accuracy of 0.1% of Vdd, then total number of possible points in the binary search range (of 0 to 2*Vdd) would be 2000 and hence the number of binary search iterations (simulations) required equals 10. Assuming NIC is performed for five vectors, eight loads (fan-out), eight widths, three arcs, two glitch types (falling and rising), three PTV (process, temperature, voltage) conditions and 10 binary search iterations, the number of computations (Nnic) required to determine NIC for a cell equals (5*8*8*3*2*3*10=57600) in one prior approach, wherein '*' represents multiplication operation.

A library may contain 1000 cells, and thus the total number of simulations is of the order of 50 millions, which requires substantial computational resources. Various aspects of the present invention reduce such computational requirements as described below.

III. B. Method

Figure 4:
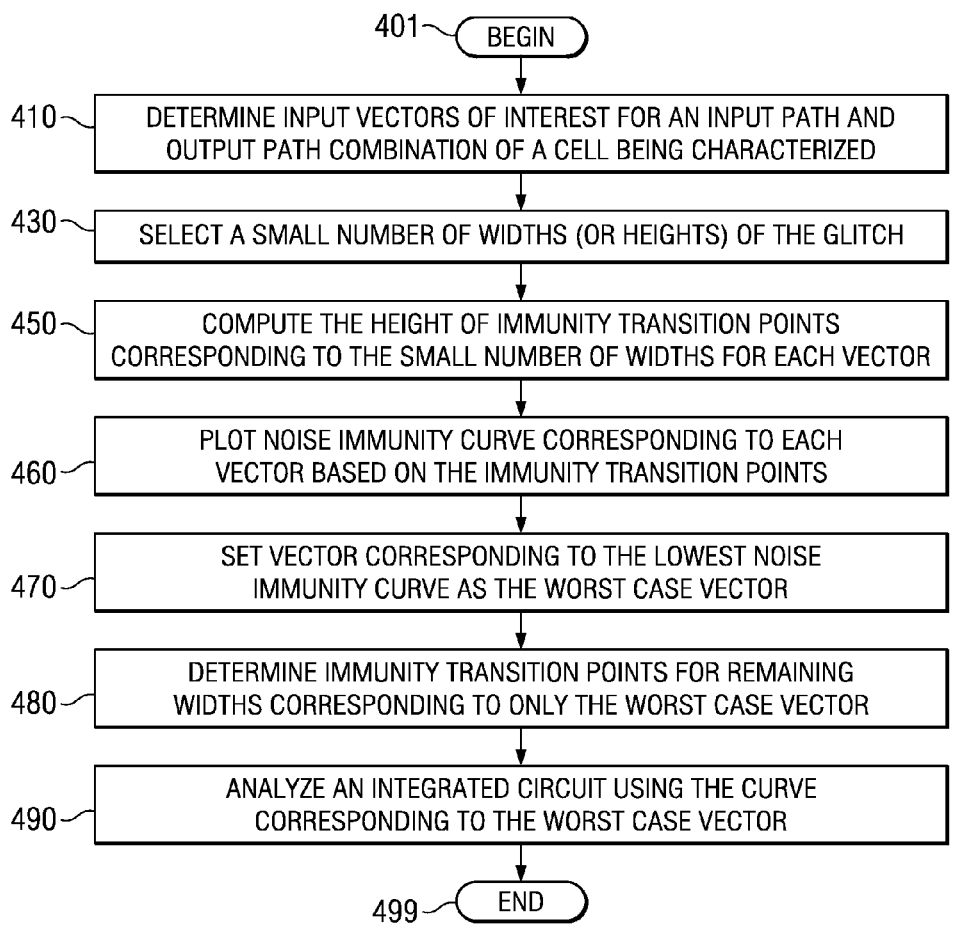
FIG. 4 is a flow chart illustrating the manner in which computations may be reduced while performing noise immunity analysis according to an aspect of the present invention.

FIG. 4 is a flow chart illustrating the manner in which computations may be reduced while characterizing noise immunity parameter according to an aspect of the present invention. The flow chart is described with reference to FIG. 5 (having width and height of glitches on X and Y axis respectively) for illustration. The flow-chart begins in step 401, in which control immediately passes to step 410.

In step 410, the input vectors of interest for an input and output path combination of a cell being characterized are determined. In an embodiment, a combination of bit values for the other pins is considered an input vector only if a change in logic value on the input pin would cause a change in logic value on the output pin of the cell. The input vectors can be determined by analyzing the truth table of cell to be characterized. For illustration, it is assumed that three vectors are identified.

In step 430, a small number of widths or heights (one dimension/coordinate) of the glitch are selected. With respect to the graph of FIG. 2B, such a step may be implemented by selecting a small number of points on either X-axis or Y-axis. In an embodiment, two points are selected towards the respective ends and one point is selected towards the middle, where the curves are likely to inflect/curve substantially. For example, with reference to FIG. 5, points 510, 512 and 511 respectively represents the widths at lower end, higher end and middle where the inflection points are expected for the immunity curves.

In step 450, the height of immunity transition points corresponding to the three widths are determined for each immunity vector. The height (or other dimension for the immunity transition point, in general) can be determined using various well-known techniques. In one embodiment, a binary search technique is employed to determine the height for each point. The number of searches/simulations can be reduced further according to various aspects of the present invention, as described in further detail in sections below.

Figure 5:
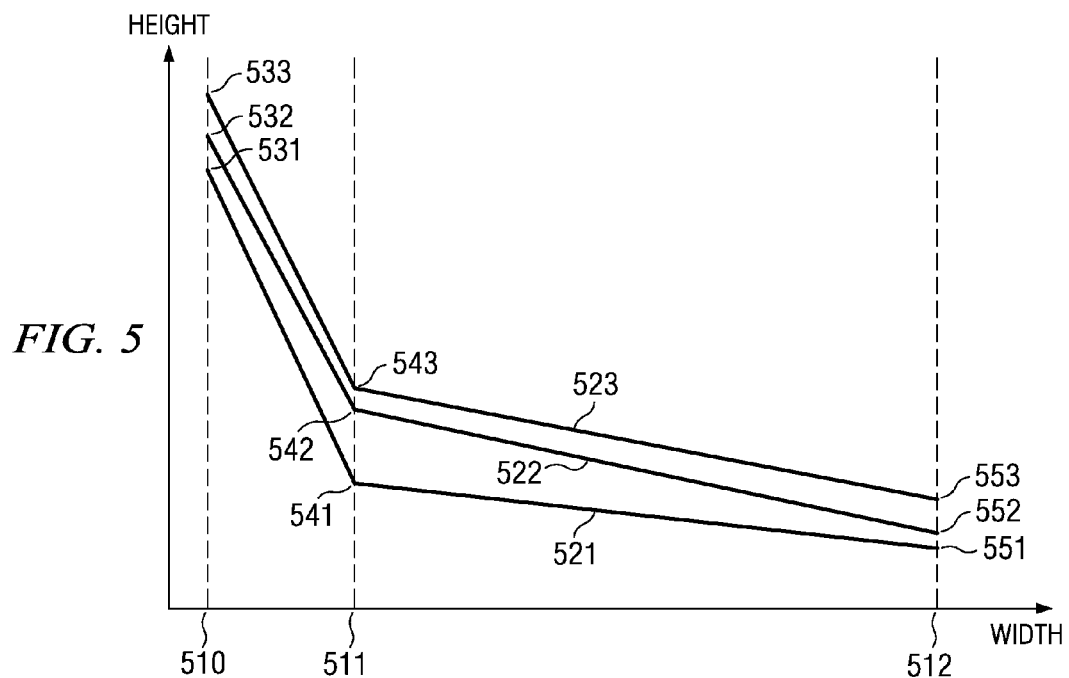
FIG. 5 depicts curves illustrating the selection of worst case curve when there is no cross-over of the curves fitted by a few immunity transition points in an embodiment of the present invention.

With respect to FIG. 5, points 531, 532 and 533 are determined respectively for the three vectors for first width 510, points 541, 542 and 543 are determined respectively for the three vectors for third width 511, and points 551, 552 and 553 are determined respectively for the three vectors for second width 512.

In step 460, curve (representing approximate noise immunity curve) corresponding to each vector is plotted based on the immunity transition points. Curve fitting techniques may be employed to generate each noise immunity curve. In one embodiment, the curves are generated using Levenberg-Marquarndt technique described, for example, in a text book entitled, "Numerical Recipes: The Art of Scientific Computing" by B. P. Flannery, S. A. Teukolsky and W. T. Vetterling, (ISBN_0_521_43108_5), Cambridge University Press. An example of such an approach is described in sections below.

With reference to FIG. 5, immunity curves 521, 522 and 523 are respectively shown plotted using respective sets of points {521, 531, and 541}, {522, 532, and 542} and {523, 533, and 543}. It should be understood that the by including more points in steps 430 ad 450, more accurate curves can be generated. However, the computational requirements are correspondingly enhanced.

In step 470, the vector corresponding to the lowest noise immunity curve (i.e., with least height for each given width) is set as the worst case vector. With reference to FIG. 5, vector 521 at the lowest position among the three vectors is set as the worst case vector.

In step 480, immunity transition points for the remaining widths corresponding to only the worst case vector are determined. That is for each point in one dimension, the value in the other dimension is determined. The corresponding noise immunity points are plotted to generate the noise immunity curve accurately.

In step 490, an IC is analyzed for cross-talk noise using the immunity curve corresponding to the worst case vector determined in step 480. In general, the glitch (on an input pin) width and height would be determined/computed during the noise analysis, and the worst case immunity curve is examined to determine whether the computed output glitch is in the failure area or safe area. If there is a failure result (or result falls in the failure area), the portion of the circuit affecting the signal on the corresponding net would need to be redesigned.

In an embodiment, the same noise immunity curve is used to determine failures/violations, irrespective of the specific vector applied to the inputs. If a cell is deemed to be acceptable in the analysis with respect to the worst case vector, the cell may be deemed to be acceptable with other vectors as well. However, as noted above, the actual vectors are generally not known in situations such as static noise analysis (SNA) and using worst case vector ensures acceptable noise in the operation of an IC for other vectors. The method ends in step 499.

The approach of above was described assuming that the noise immunity curves do not cross one another, as shown in FIG. 5. However, the noise immunity curves can cross over and the approach described above can be extended as described below.

III.C. Noise Immunity Curves with Cross-Overs

Figure 6:
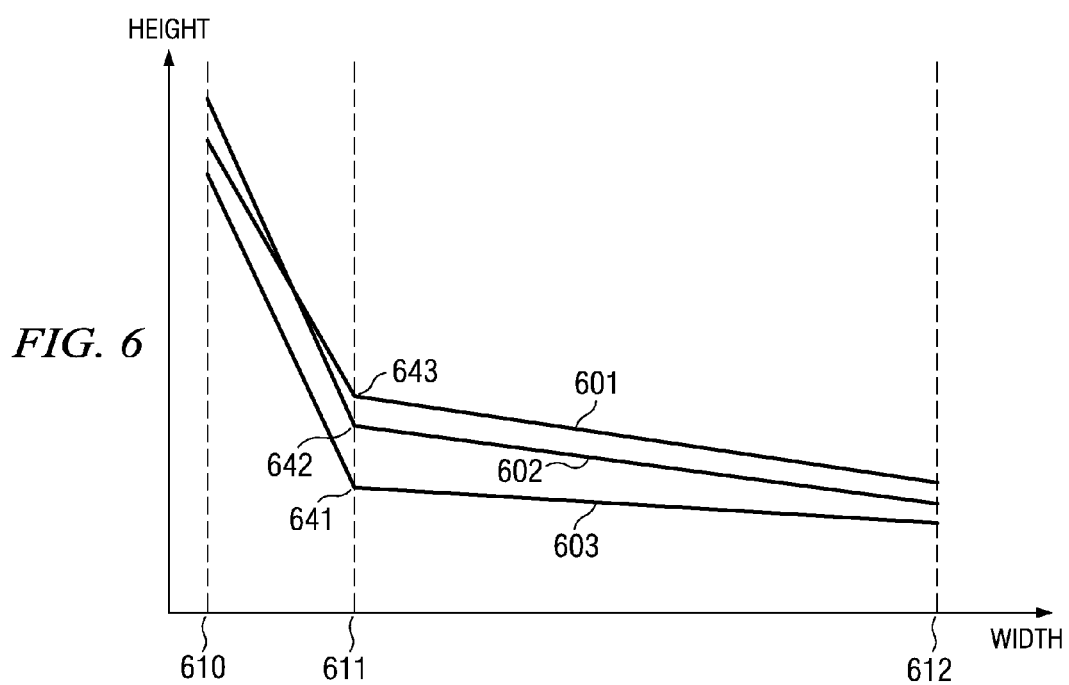
FIG. 6 depicts curves fitted from a few immunity transition points illustrating the selection of worst case curve when top curves are crossing in an embodiment of the present invention.

FIG. 6 depicts three noise immunity curves 601, 602 and 603, with the curves 601 and 602 crossing. Curve 603 represents the worst-case immunity curve (and is not crossing other curves). In such a case (in which the worst case curve is not crossing), the approach of FIGS. 4 and 5 can be used. The description is continued with respect to a scenario there is a crossing of curves at the lowest level, and thus there is not one curve which can be termed as a worst case curve.

Figure 7:
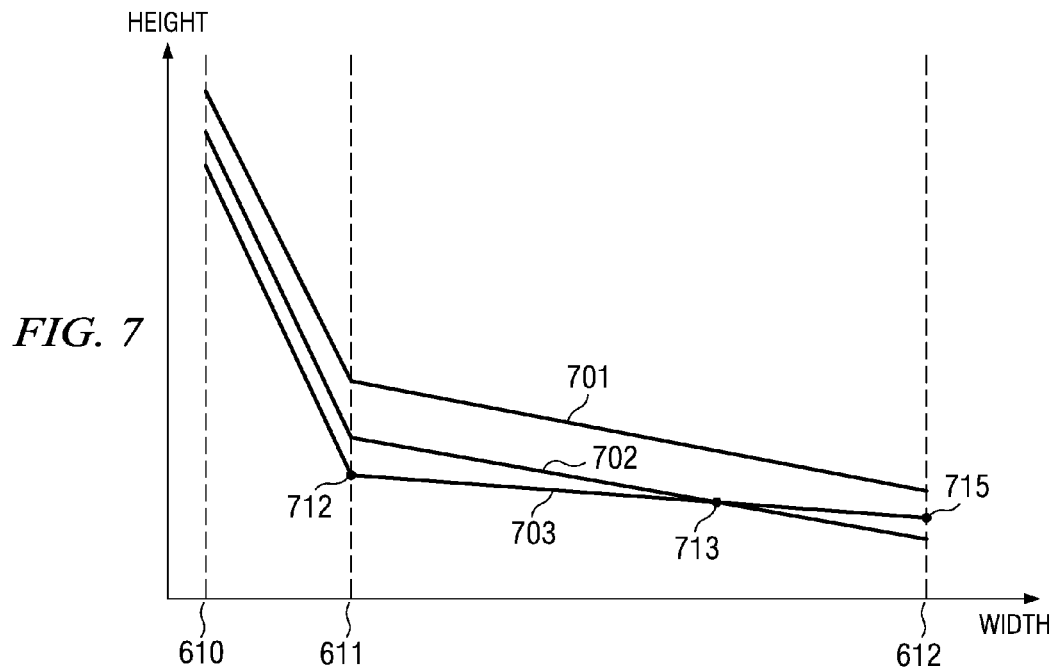
FIG. 7 depicts curves fitted from a few immunity transition points illustrating the presence of more than one worst case curve.

FIG. 7 depicts a scenario in which two curves (702 and 703) at the lowest level are crossing over at time point 713. In such a case, in one embodiment, each of the two curves is treated as a worst case curve in all further analysis. That is, characterization data may be generated for both curves.

In an alternative embodiment, the width until which the two curves do not cross over, the lower curve 703 is used as the worst case curve and after the cross-over, two curves 702 and 703 are used as the worst case curves. Due to the use of such worst case transition points from both the curves, the approach may reliably indicate at least problems which are likely to occur.

IV. Noise Propagation (NP) Parameters

IV. A. General Introduction

As noted above, noise propagation parameters specify whether an output pin of a cell would switch (and possibly cause a wrong value to be latched in a subsequent cell) in response to a glitch of a given width and height. Noise propagation is measured for combinational cells. In general, NP data is measured by injecting an input glitch of known width and known height and measuring corresponding output glitch height and output glitch width. In one prior approach, the NP data is plotted as described below with reference to FIGS. 8A and 8B.

Figure 8A:
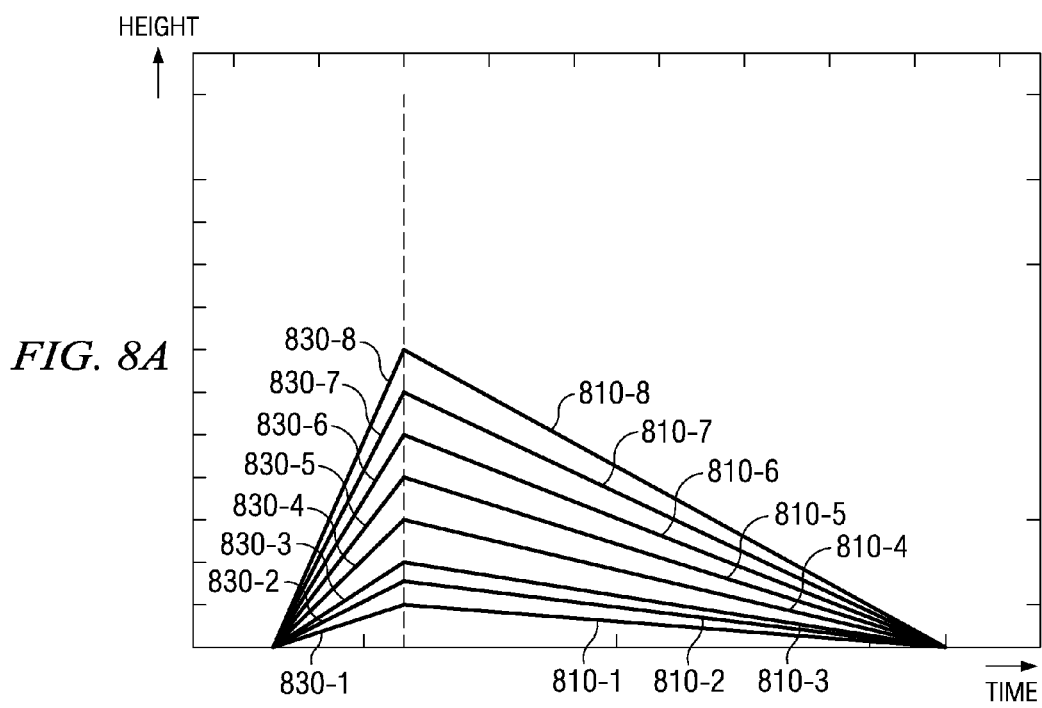
FIG. 8A is a graph illustrating the input glitches applied to a buffer.
Figure 8B:
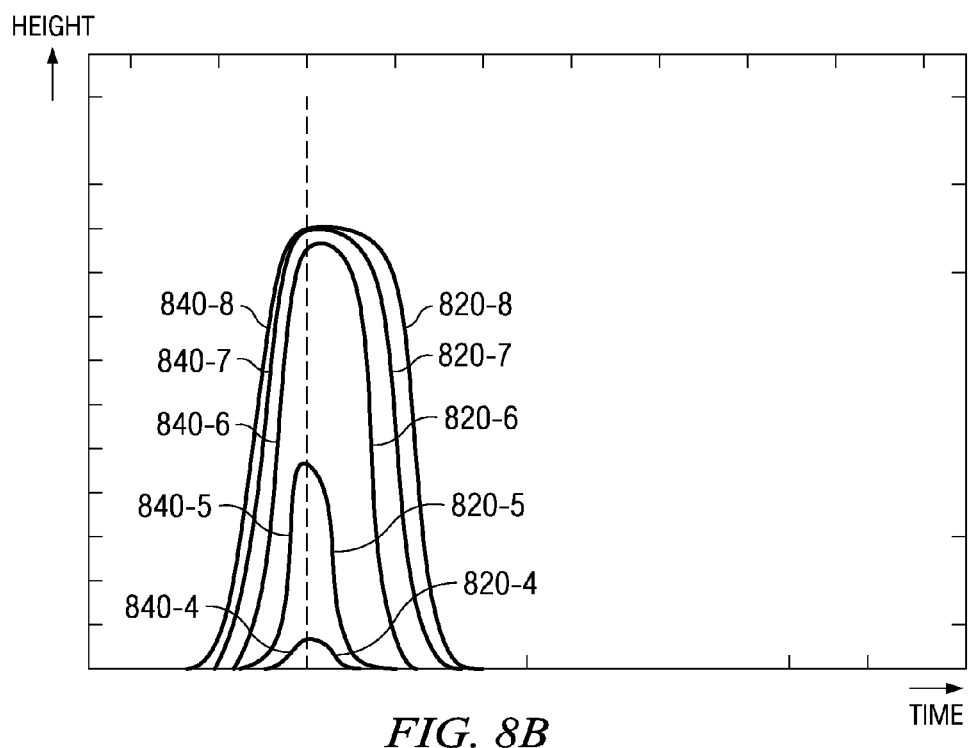
FIG. 8B depicts the signals at an output pin of the buffer in response to the input glitches of FIG. 8A.

FIG. 8A is a graph illustrating the input glitches applied to a buffer and FIG. 8B depicts the corresponding responses at an output pin. All input glitches 810-1 through 810-8 are shown having the same width and the output responses of FIG. 8B correspond to a single vector.

As may be appreciated, up to some threshold value of input voltage, the buffer blocks the input from being propagated to the output. In other words, the buffer does not respond to certain threshold heights in case width is fixed, as shown in FIG. 8B. Accordingly, corresponding to input glitches 810-1 through 810-3 are not shown in FIG. 8B. On the other hand, output responses 820-4 through 820-8 are generated in response to input glitches 810-4 through 810-8.

Further, the input peaks for glitches 810-1 through 810-8 are respectively shown at 830-1 through 830-8, and the output peaks are shown as points 840-4 through 840-8 when the buffer passes the input glitch in the case of output responses 820-4 through 820-8.

Figure 9:
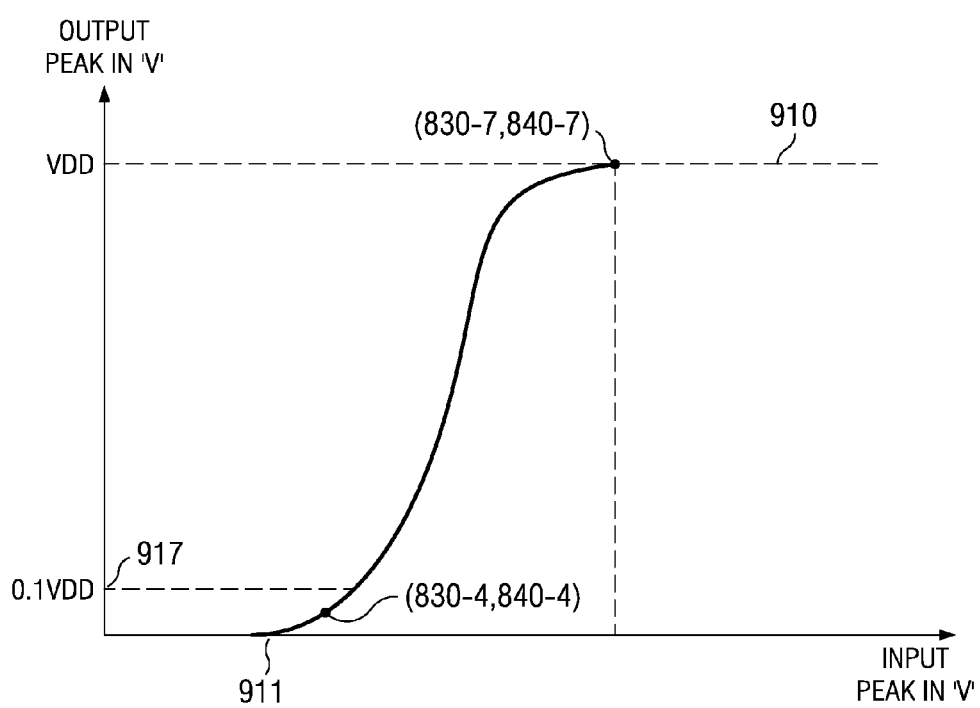
FIG. 9 is a graph illustrating noise propagation (NP) curve with the peak values of input glitches shown on X-axis and the corresponding peaks of the output responses shown on Y-axis.

FIG. 9 contains a graph with the peak values of input glitches shown on X-axis and the corresponding peaks of the output responses shown on Y-axis. The peak value is shown as zero until the input peak equals or exceeds 810-4 (as shown at point (830-4, 840-4)), and saturates at voltage level Vdd corresponding to input peak 830-7 (as shown at point (830-7, 840-7)). Even if the input peak is increased after that point, the output peak remains the same, as shown by the flat portion. Similarly, the flat portion below represents a situation in which the input glitch is blocked until the peak exceeds certain value (911).

Voltage level 917 represents the threshold voltage for the noise immunity analysis, and represents 10% of the supply voltage (Vdd). Input peak value on X-axis corresponding to voltage level 917 represents immunity transition point, which may be used to determine NIC as described in sections below with reference to FIG. 20.

It should be appreciated that the curve of FIG. 9 may be referred to as a noise propagation (NP) curve, and is only for a combination of one width and one vector. In one prior embodiment, a similar NP curve is generated for various combinations of widths and vectors before analysis for cross talk noise is performed for an integrated circuit (IC).

During analysis, the width and height of an input glitch at an input pin/net may be provided by the analysis tool, and the NP curve (data) may be analyzed to determine the extent to which the input glitch is propagated to an output pin. The glitch that would be presented on output pin could be used in analyzing the behavior of subsequent cells. From the above, it may be appreciated that substantial computational resources may be required to determine the curves (as in FIG. 9) corresponding to various combinations of glitch width and vector values.

For example, assuming that the maximum input glitch height is 2*Vdd and NP step size equals 10% of Vdd, each NP curve would contain 20 points. Assuming NP chracterization is performed for five vectors, eight loads (fan-out), eight widths, three arcs, two glitch types (falling and rising), three PTV (process, temperature, voltage) conditions and 20 points in each NP curve, the number of computations (Nnp) required to chracterize NP for a cell equals (5*8*8*3*2*3*20=115200) in one prior approach, wherein '*' represents multiplication operation.

A library may contain 1000 cells, and thus the total number of simulations is of the order of 100 millions, which requires substantial computational resources. An aspect of the present invention reduces the computational requirements as described below with reference to FIG. 10.

IV.B. Reducing Computational Requirements for Noise Propagation Analysis

Figure 10:
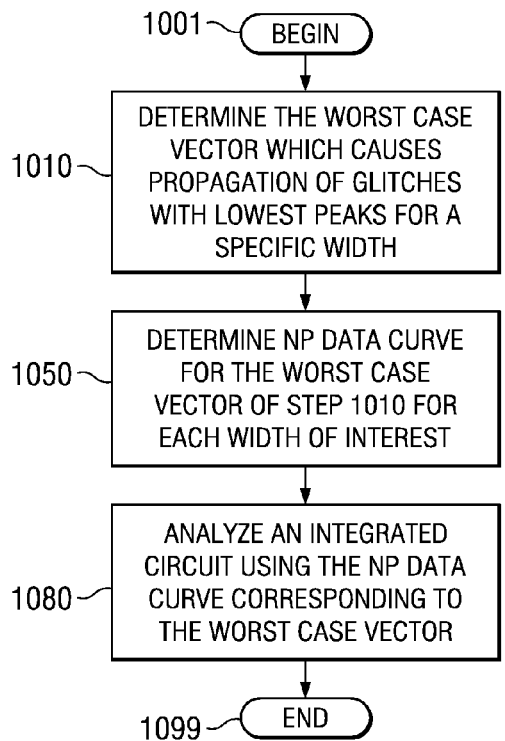
FIG. 10 is a flow chart illustrating the manner in which computations may be reduced while performing noise propagation analysis according to an aspect of the present invention.

FIG. 10 is a flow chart illustrating the manner in which computations may be reduced while performing noise propagation analysis according to an aspect of the present invention. The flow-chart begins in step 1001, in which control immediately passes to step 1010.

In step 1010, the worst case vector for an input pin and output pin combination, which would propagate most noise from the input pin to the output pin among all the vectors of interest, is determined. Such a worst case vector may be determined using various techniques.

In one embodiment, the worst case vector set in step 470 is determined as the worst case vector for step 1010 as well. Such an approach is based on the fact that there is commonality between noise propagation analysis and noise immunity analysis given that a cell generally gets configured (e.g., transistors being off/on) based on the input vector, and the signal propagation occurs from similar configuration in the case of both the analysis. In addition, since by definition, failure result for a NIC is placed at specific points (corresponding to 10% of maximum height of the output glitch) on the NP curves, such use of the same vector as a common worst case vector may be justified.

In step 1050, the NP data curve (similar to in FIG. 9) is determined for the worst case vector of step 1010 for each (glitch) width of interest. Each point of each NP data curve may be determined using a known way.

In step 1080, an integrated circuit (IC) is analyzed using the NP data curve corresponding to the worst case vector. That is, once a input glitch of a given width and height is known, the NP data curve corresponding to the width may be selected first, and the height (X-axis) of the input glitch may be used to determine the expected height of the output glitch from the NP noise data. The expected height of the output glitch can be used to analyze the IC further. The flow chart ends in step 1099.

It may be appreciated that the computational complexity is substantially reduced since NP data (curve) is determined for only one vector. In one scenario, the number of simulations were reduced by more than half compared to a scenario in which parameter data related to all the vectors is determined. In addition, as the worst case vector is determined in common for both immunity and propagation analysis, the additional overhead is reduced. As noted above, at least in static analysis type situations, the data corresponding to worst case vectors may be acceptable (or even desirable).

V. Reducing Computations in Determining Immunity Transition Points

V.A. General Introduction

As described above with reference to FIG. 2A, immunity transition points form an immunity curve separating the point of failure ("failure area") and the "safe area". There is often a need to determine the immunity transition points. For example, as noted above, with reference to step 480, immunity transition points may need to be determined for the worst case vector with the lowest noise immunity.

In one prior embodiment, a 'search' is performed between 0 and Vdd voltage (maximum possible height for input glitches) for each immunity transition point. In general, a search entails multiple simulations until the immunity transition point is determined with a desired accuracy (i.e., a change of the immunity transition point by the desired accuracy should change the result of the noise immunity analysis). Simulations require computational resources, and it is desirable to reduce the number of simulations. An aspect of the present invention enables such reduction in the search range (and thus the number of simulations), as described below in further detail.

V.B. Determining Noise Immunity Curve

Figure 11:
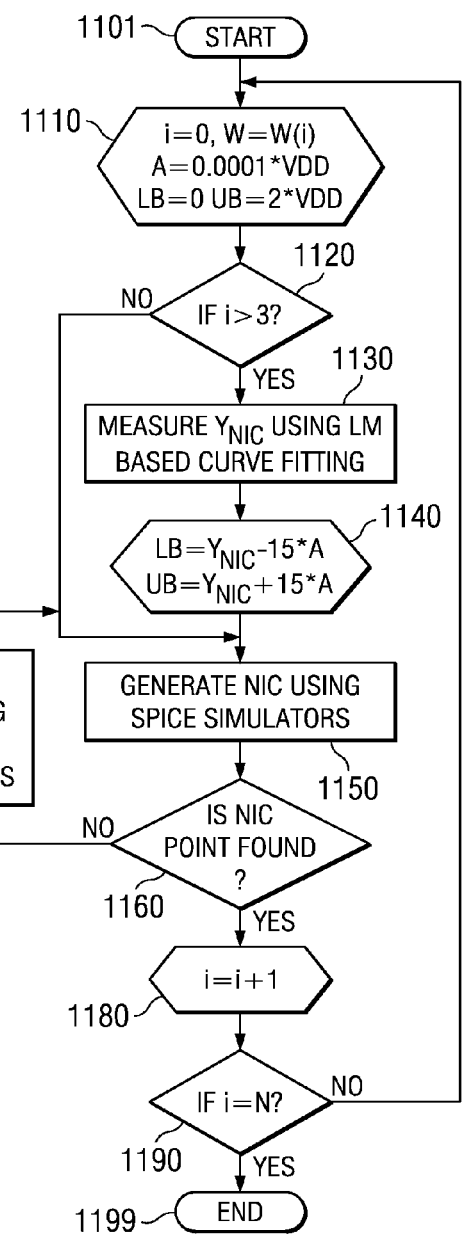
FIG. 11 is a flow chart illustrating the manner in which immunity transition points on a noise immunity curve may be determined using curve fitting technique according to an aspect of the present invention.

FIG. 11 is a flow chart illustrating the manner in which a noise immunity curve may be determined according to an aspect of the present invention. The flow chart is described with reference to the graph of FIG. 12, which contains the width of an input glitch on X-axis and the height on the Y-axis. The flow chart begins in step 1101, in which control immediately passes to step 1110.

In step 1110, a variable 'i' representing the width number presently being determined, is set to 1 (indicating that the first width is being computed). Variable A, representing the desired accuracy is set to (Vdd*0.0001), wherein Vdd represents the supply voltage, the lower bound (LB) is set to 0, and the upper bound (UB) is set to (2*Vdd).

In step 1120, a determination is made as to whether i is greater than 3. Control passes to step 1130 if i greater than 3, and to step 1150 otherwise. As will be appreciated, after the first three iterations (corresponding to i values of 1, 2 and 3), the initial search range for subsequent widths is determined according to an aspect of the present invention to minimise the computational requirements.

The steps of 1150, 1160 and 1170 operate to perform a search in the initial range defined variables UB and LB for each value of i.step 1150, the output response corresponding to the input glitch of width W[i] is examined. The output response is generated by simulation using tools such as SPICE simulators available in the market place.

In step 1160, a determination is made as to whether the immunity transition point is found with accuracy A. An immunity transition point would be deemed to be found if a change of value by amount A would change the result of analysis from failure to pass or vice versa. Control passes to step 1180 if immunity transition point is found, and to step 1170 otherwise.

In step 1170, the UB and LB values are adjusted according to the results of the simulation. Assuming a binary search technique, depending the failure or pass (not failure) result of the prior simulations, the UB and/or LB values are adjusted to correspond to the binary search principle, and may be performed in a known way. Control again passes to step 1150 with the resulting UB and LB values.

Steps 1130 and 1140 operate to reduce the computational requirements after the first three data points of a immunity curve are determined. As may be appreciated from the description above, the search for each of the first three noise immunity points is in the range 0 and (2*Vdd) due to the initialization in the step 1110. However, due to the operation of steps 1130 and 1140 the search range is reduced to a narrower range, thereby reducing the computation requirements, as described below.

Figure 12:
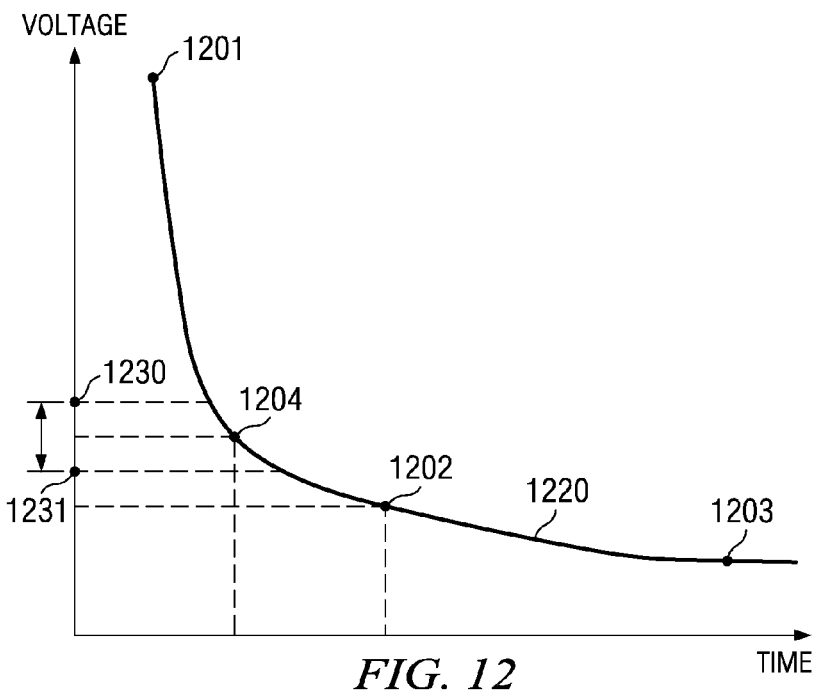
FIG. 12 depicts a curve fitted from a few immunity transition points illustrating the selection of search range to determine immunity transition point according to an aspect of the present invention.

For illustration, with reference to FIG. 12, it is assumed that points 1201, 1202 and 1203 are determined in the first three iterations. The manner in which the remaining immunity transition points are determined according to various aspects of the present invention, is described below in further detail.

Continuing with reference to FIG. 11, in step 1130, a variable Ynic is measured by fitting into an immunity curve the heights measured thus far (only three when control passes to step 1130 the very first time), and by mapping the width of the present iteration into curve. Such an approach provides a fairly good prediction of the height for noise immunity analysis purpose since it has been observed that noise immunity curves approximately follow a hyperbolic equation for each vector. Various techniques can be used for curve fitting and Levenberg-Marquardt technique noted above is used for the curve fitting.

With reference to FIG. 12, it is assumed that curve 1220 is generated by appropriate curve fitting technique and to determine the glitch height corresponding width W2, variable Ynic is set to the Y-coordinate for the point 1204. The search range is set between Y-coordinates 1231 and 1232 for the glitch width of W2 as described below.

In step 1140, the search range is set to a narrow band around the computed Ynic. For illustration, it is assumed that the search range is set between (Ynic+15*A) and (Ynic−15*A) by setting the variables UB and LB appropriately. Control then passes to step 1150. As noted above, steps 1150, 1160 and 1170 operate to determine the minimum height at which the output signal of a cell exceeds a pre-specified threshold (for the present width).

In step 1180, variable i is incremented by one to process the next width. In step 1190, the value of i is compared with N (total number of widths) and control passes to step 1199 if i is greater than N, and to step 1110 otherwise. The method ends in step 1199. It should be appreciated that the curve can be refined further as each immunity transition point is accurately determined, thereby enhancing the accuracy of the search range in determining the next immunity transition points.

Due to the use of a smaller search range in steps 1130 and 1140, the computational requirements in generating a noise immunity curve may be reduced. For example, without using steps 1130 and 1140, the total number of possible points to search will be 2000 (binary search range 0 to 2VDD), and 10 binary search iterations will be required to get NIC data for a given input glitch. On the other hand, by using steps 1130 and 1140, the number of iterations can be reduced to 5 (since 30 points need to be searched), thereby reducing the computational requirements by half. Various aspects of the present invention further reduce the computational requirements, as described below.

VI. Improving Accuracy of Search Range to Determine Immunity Transition Points

VI. A. General Introduction

One problem with the approach of FIGS. 11 and 12 described above is that the prediction of possible value/height of a immunity transition point for a given width (and thus the range), is based on mathematical modeling of the expected NIC. The range determined accordingly may not contain the actual immunity transition point, and error recovery approaches may need to be implemented to search outside of the search range determined by steps 1130 and 1140. The computational requirements are enhanced in such scenario, and it is generally desirable to determine a search range accurately.

An aspect of the present invention takes advantage of various pieces of other information to improve the accuracy of search range as described below in further detail. First, the manner in which NP data can be used to improve the search range accuracy, is described below.

VI.B. Principle: Using NP Data

Figure 13A:
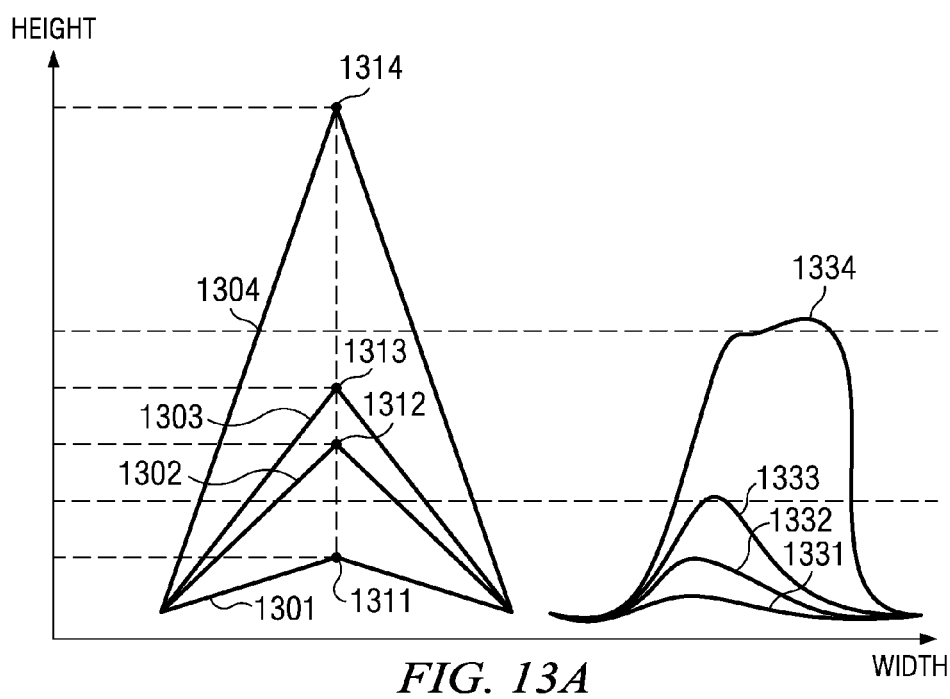
FIG. 13A is a timing diagram containing input glitches and corresponding output glitches while determining NP data.

FIG. 13A is a timing diagram of input glitches and corresponding output glitches while determining NP data. The timing diagram illustrates the manner in which the search range can be determined accurately for a given width of input glitches. The diagram is shown containing input glitches 1301-1304 of respective heights 1311-1314, and the corresponding output responses 1331-1334. For illustration, it is assumed that the height of output response 1333 exceeds the pre-specified threshold level (10% of Vdd) and the height of output response 1332 is below the pre-specified threshold level.

According to an aspect of the present invention, the search range is set between 1312 and 1333. In an embodiment, the heights of input glitches are spaced apart by 10% of Vdd, and thus the search range equals 10% of Vdd. The search range can be determined within a few simulations, for example, by using the approach described below with reference. However, the range would be accurate given that by definition, the height sought to be determined by the noise immunity analysis falls within this range. Therefore, the search range can be determined accurately by using this principle. A method using the principle is described below.

VI.C. Method: Using NP Data

Figure 13B:
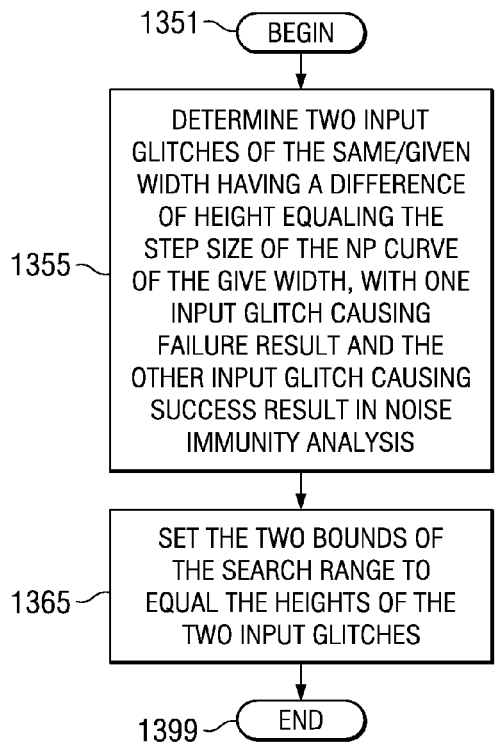
FIG. 13B is a flowchart illustrating the manner in which the search range (to determine an immunity transition point) can be determined accurately using NP data according to an aspect of the present invention.

FIG. 13B is a flowchart illustrating the manner in which the search range to determine an immunity transition point can be determined accurately according to an aspect of the present invention. The method begins in step 1351, in which control passes to step 1355.

In step 1355, two input glitches of the same/given width having a difference of height equaling the step size of the NP curve of the same width, with one input glitch causing failure result and the other input glitch causing success result in noise immunity analysis, are determined. The two input glitches may correspond to glitches 1302 and 1303 described above since the two input glitches have heights differing by the step size of the corresponding NP curve.

In step 1365, the two bounds of the search range are set to equal the respective height of the two input glitches. Thus, in the example of above, the upper and lower bounds of the search range equals value corresponding to points 1313 and 1312 respectively. Techniques such as binary searches may be applied to determine the precise/accurate immunity transition point as described above with reference to steps 1150, 1160 and 1170 of FIG. 11. As also noted there, the range determination of FIG. 13B and search of FIG. 11 can be repeated for different widths of interest. The method ends in step 1399.

Thus, the approach of FIG. 13B enables accurate determination of a search range. Other approaches can also be used to further constrain the search range as described below.

VI.D. Using Data from Determined Immunity Transition Points

Figure 14A:
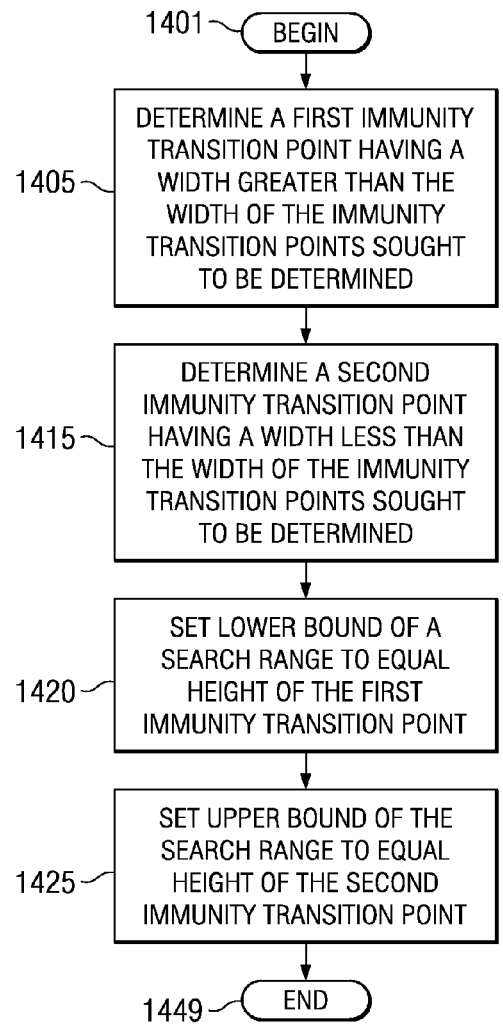
FIG. 14A is a flowchart illustrating the manner in which data related to determined immunity transition points may be used to determine the search range accurately while generating a noise immunity curve according to an aspect of the present invention.

FIG. 14A is a flowchart illustrating the manner in which data related to determined immunity transition points may be used to determine the search range accurately while generating a noise immunity curve. The approach is based on a recognition that larger (or at least not less than) height is required to cause a failure result when a narrower glitch is used. The flowchart is described with reference to FIG. 14B (containing time/width on X-axis and height of input glitch on Y-axis) for illustration. The method of FIG. 14A begins in step 1401, in which control immediately passes to step 1405.

In step 1405, a first immunity transition point is determined, with the first immunity transition point having a width greater than the width of the immunity transition points sought to be determined. Similarly, in step 1415, a second immunity transition point is determined, with the second immunity transition point having a width less than the width of the immunity transition points sought to be determined.

The first and second immunity transition points may be determined based on pre-determined information. In an embodiment, immunity transition points corresponding to narrow width and widest width are determined first by simulation and the immunity transition point corresponding to middle width is sought to be determined. In such a situation, the first and second immunity transition points would equal the immunity transition points corresponding to the narrow and widest widths. The first and second transition points corresponding to remaining widths may be determined based on the pre-determined immunity transition points of closest widths.

Figure 14B:
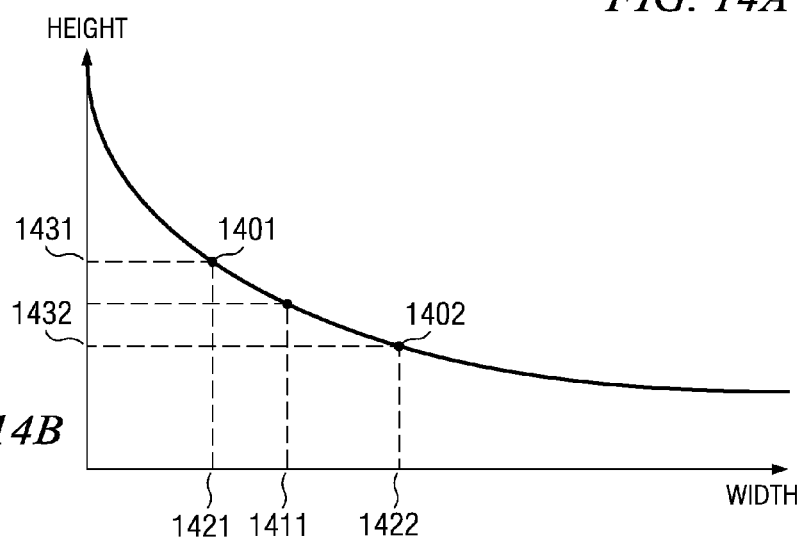
FIG. 14B depicts curve fitted from a few immunity transition points illustrating the selection of a search range.

For example, with reference to FIG. 14B, assuming that points 1401 and 1402 are already determined corresponding to widths 1421 and 1422 respectively, and width 1411 represents the width for which the immunity transition point is sought to be determined, points 1401 and 1402 respectively correspond to the second and first immunity transition point respectively.

In step 1420, the lower bound of the search range is set to equal the height of the first immunity transition point, and in step 1425 the upper bound of the search range is set to equal the height of the second immunity transition point. Thus, the search range is between coordinate values represented by 1431 and 1432. The method ends in step 1449.

As may be appreciated, the search range according to FIGS. 14A and 14B becomes more accurate as more immunity transition points are determined. The approaches of above (FIGS. 11, 13B and 14A) can be combined to determine a narrow and accurate search range as described below with reference to FIGS. 15 and 16.

VI.E Accurate and Narrow Search Range for Noise Immunity Analysis

Figure 15:
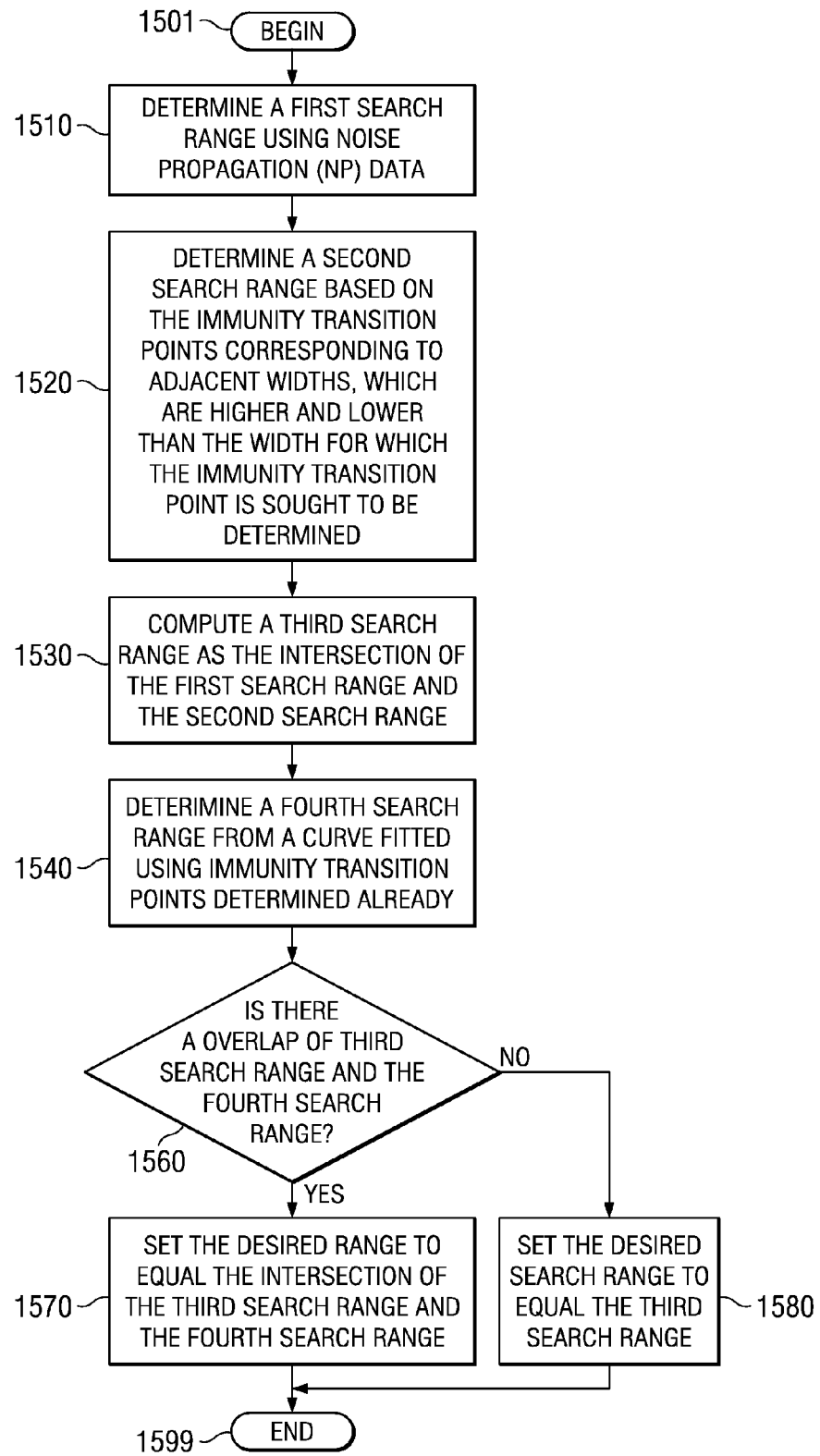
FIG. 15 is a flow chart illustrating the manner in which various approaches described above can be combined to generate a narrow and accurate search range according to an aspect of the present invention.

FIG. 15 is a flow chart illustrating the manner in which various approaches described above can be combined to generate a narrow and accurate search range. The flowchart is described with reference to FIGS. 16A and 16B. The flowchart begins in step 1501 in which control immediately passes to step 1510.

In step 1510, a first search range is determined using noise propagation (NP) data. The approaches described above with respect to FIGS. 13A and 13B may be used for such a determination.

In step 1520, a second search range is determined based on the immunity transition points corresponding to adjacent widths, which are higher and lower than the width for which the immunity transition point is sought to be determined. The approaches described above with respect to FIGS. 14A and 14B may be used for such a determination.

In step 1530, a third search range is determined as the intersection of the first search range and the second search range. It may be appreciated that the third search range represents an accurate search range since both the first search range and the second search range would contain the immunity transition point sought to be determined. Further refinement of the search range may be possible, as described below.

In step 1540, a fourth search range is determined from the curve fitted using immunity transition points determined already. The determination may be performed as described above with respect to FIGS. 11 and 12.

In step 1560, a determination is made as to whether there is a overlap of the third search range and the fourth search range. Control passes to step 1570 if there is a overlap, and to step 1580 otherwise.

Figure 16A:
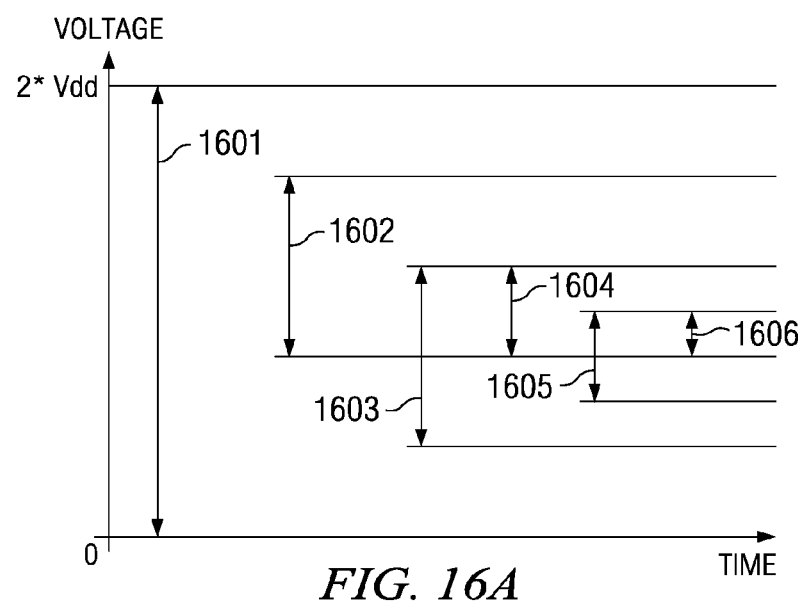
FIGS. 16A and 16B are logical diagrams together illustrating the selection of the search range from the search ranges determined in an embodiment of the present invention.

Step 1570 corresponds to a situation depicted in FIG. 16A, in which the entire potential search range from 0 to 2*Vdd is shown as 1601. The first, second, third and fourth search ranges are shown as 1602, 1603, 1604 and 1605 respectively. As can be readily appreciated, there is a overlap between ranges 1604 and 1605, and the overlap is shown as range 1606. In step 1570, range 1606 is set as the desired range in which further search is to be conducted to determine the immunity transition point.

Figure 16B:
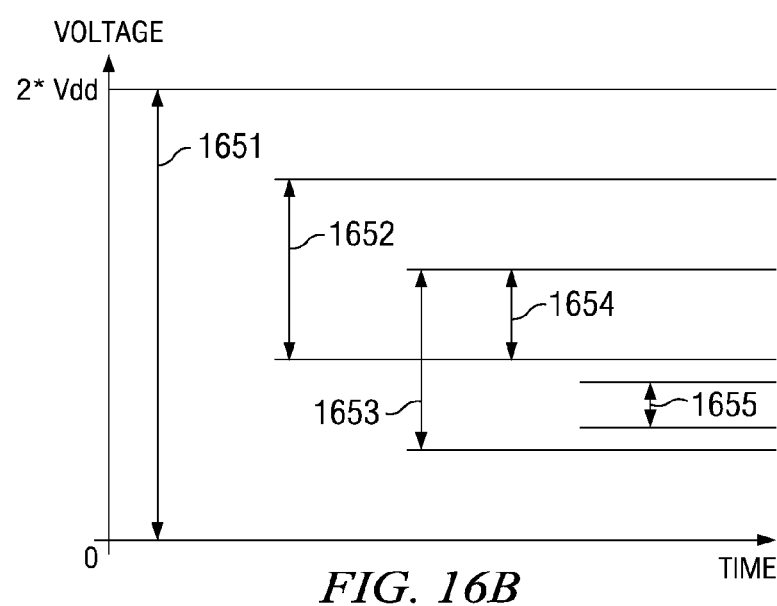

Step 1580 corresponds to the situation in FIG. 16B, in which the entire potential search range from 0 to 2*Vdd is shown as 1651. The first, second, third and fourth search ranges are shown as 1652, 1653, 1654 and 1655 respectively. As can be readily appreciated, there is no overlap between ranges 1654 and 1655. In step 1570, third range 1654 is set as the desired range in which further search is to be conducted to determine the immunity transition point. The method ends in step 1599.

It may be appreciated that the search may be determined accurately and narrowly by using some of the techniques described above while performing noise immunity characterization. The manner in which computational requirements can be reduced for NP characterization also, is described below in further detail.

VII. Reducing Computations Further in Determining NP Data

VII.A. General Introduction

Figure 17:
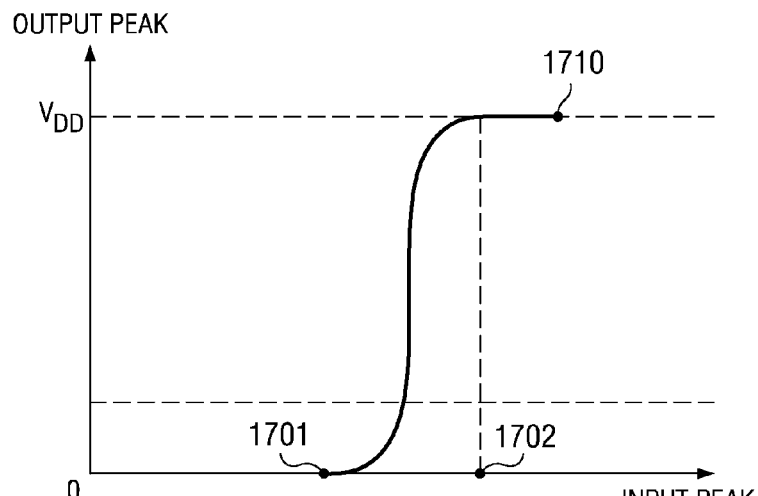
FIG. 17 depicts NP curve illustrating the need to place a start point in a transition region when determining the points of the NP curve.

It is helpful to note that NP data indicates the height and width of an output glitch in response to an input glitch of a given height and width. Of interest is NP curve 1710 depicted in FIG. 17. NP curve 1710 represents the height of the output glitch (on Y-axis) for a corresponding height of the input glitch (on X-axis). NP curves may be generated for each width of interest.

In one prior embodiment, a simulation is performed for each height of interest of input glitch to generate the corresponding points on NP curve 1710. For example, assuming there are 20 input peaks of interest (i.e., number of points on each NP curve) corresponding to a step size of 10% of Vdd (maximum input glitch height of 2*Vdd), a corresponding number of simulations are performed for each width (NP curve). An aspect of the present invention reduces the number of such simulations, as described below with respect to FIG. 18.

VII.B. Reducing Number of Simulations

Figure 18:
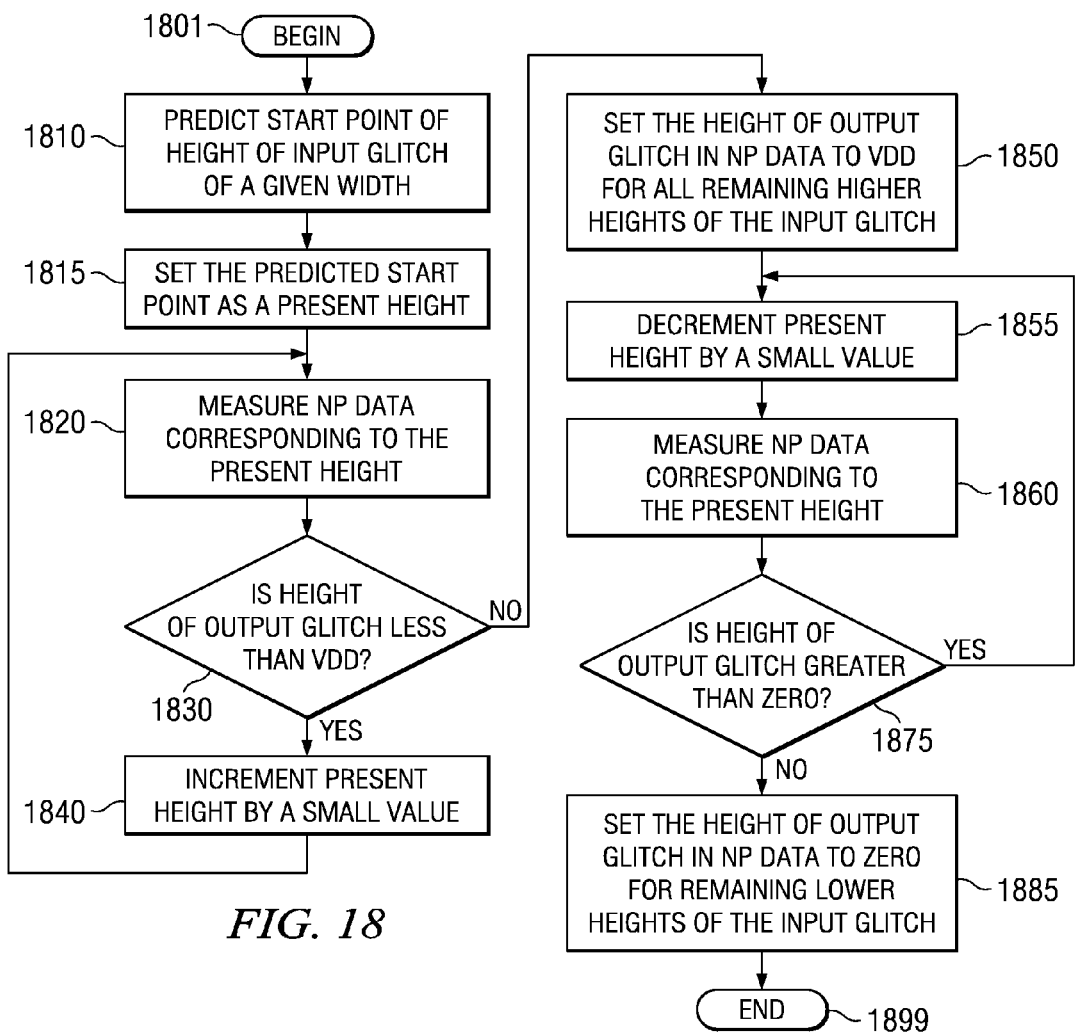
FIG. 18 is a flowchart illustrating the manner in which the number of simulations can be reduced while generating a NP curve according to an aspect of the present invention.

FIG. 18 is a flowchart illustrating the manner in which the number of simulations can be reduced while generating a NP curve (for a given width) according to an aspect of the present invention. The flowchart is described with reference to FIG. 17. The flowchart starts in step 1801 in which control immediately passes to step 1810.

In step 1810, a start point of height of input glitch (of a given width) is predicted. As described below with reference to FIG. 19 below, the start point should preferably fall between points 1701 and 1702, in which the curve is operating in a transition region (i.e., the output peak changes substantially with a change in the input peak).

In step 1815, the predicted start point is set as a present height. In step 1820, the NP data (the height and output of the output glitch) corresponding to the present height is measured. In an embodiment, a simulation tool provides the area and height of the output signal. The output glitch is approximated to a triangle signal, and the width of the output glitch is computed based on the area and the height.

In step 1830 a determination is made as to whether the height of output glitch is less than Vdd. If the height of output glitch is less than Vdd, control passes to step 1840, otherwise to step 1850. In step 1840, the present height is incremented by a small value. In an embodiment, the present height is incremented by 0.1 volts (10% of Vdd). Control then transfers to step 1820.

Control reaches step 1850 when the input height is greater than or equal to the coordinate value corresponding to point 1702. In step 1850, the height of output glitch in NP data is set to Vdd for all remaining higher heights (with X-coordinate value greater than 1702) of the input glitch. Such an approach may be appreciated by noting that the output glitch height remains substantially same in response to increments after point 1702. In addition, the width of the output glitches may not be needed in such a region.

In step 1855, the present height is decremented by a small value (say 0.1 Vdd). In step 1860, the NP data corresponding to the present height is measured. In step 1875, the height of the output glitch is compared with zero (or substantially close to 0). If the height of the output glitch is greater than the compared value, control passes to step 1855, otherwise to step 1885.

Control reaches step 1885 when the input height (height of the input glitch) is less than or equal to the coordinate value corresponding to point 1701. In step 1885, the height of output glitch in NP data is set to zero for remaining lower heights (i.e. with X-coordinate value less than 1701) of the input glitch. The flow chart ends in step 1899.

As may be appreciated, due to the operation of steps 1850 and 1855, the number of simulations, and thus the computational requirements, are reduced. The description is continued with respect to the manner in which the start point noted in step 1810 can be determined. As noted above with respect to step 1810, the start point needs to be preferably placed in the region between points 1701 and 1702.

However, the distance between 1701 and 1702 is narrow and challenges may be presented to computationally predict the start point within the region. In an embodiment, the transition region equals 100-200 mV for a Vdd of 1.5V. Various aspects of the present invention enable such a goal to be achieved with reduced computations. The technique may differ for the first three NP curves and the later NP curves, as described below.

VII.C. Determining Start Point for First Three NP Curves

Figure 19:
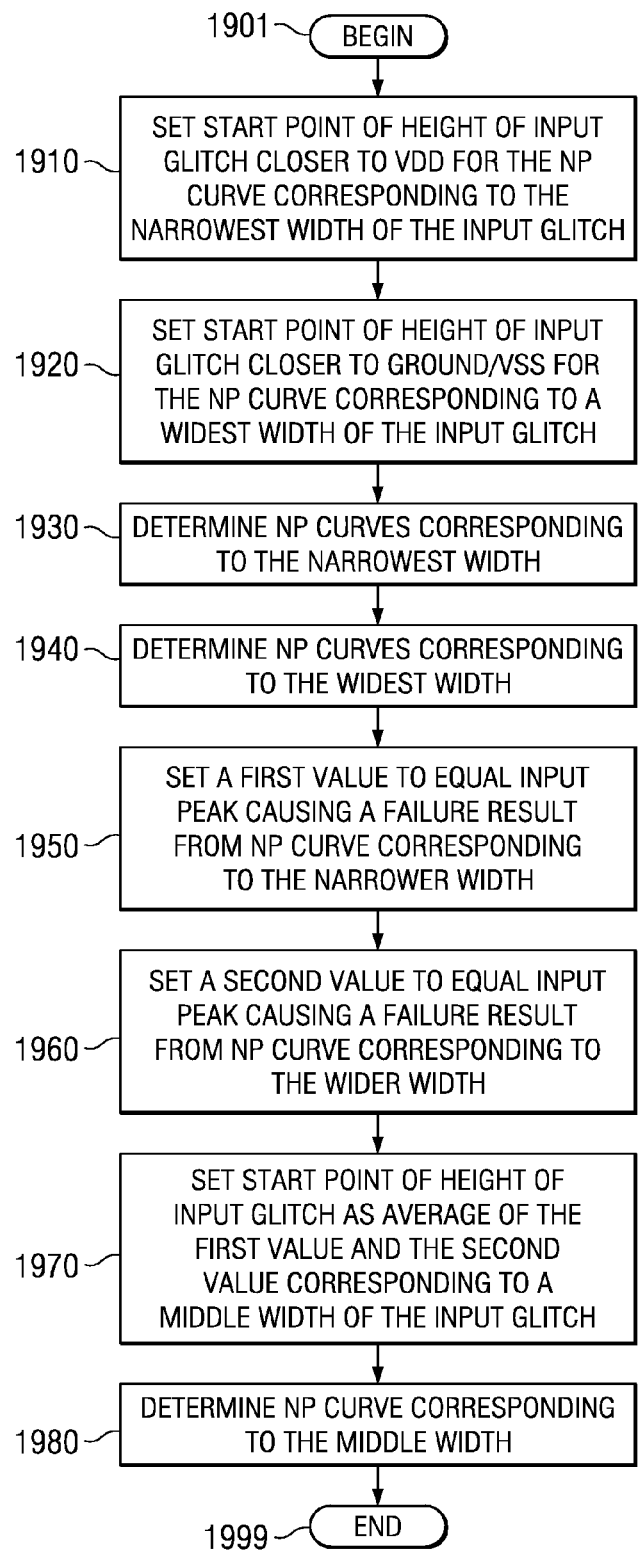
FIG. 19 is a flowchart illustrating the manner in which the start point may be placed in the transition region for the first three NP curves according to an aspect of the present invention.

FIG. 19 is a flowchart illustrating the manner in which the start point may be placed in the transition region for the first three NP curves according to an aspect of the present invention. The flowchart is described with reference to FIG. 20. The flowchart starts in step 1901 in which control immediately passes to step 1910.

In step 1910, the start point (of height of input glitch) is set closer to Vdd for a NP curve (2001 of FIG. 20) corresponding to a narrowest width of the input glitch. In an embodiment, the start point corresponding to the narrowest width is set equal to 0.7 Vdd.

In step 1920, the start point of height of input glitch is set farther Vdd (closer to Vss) for the NP curve (2003 of FIG. 20) corresponding to the widest width of the input glitch. In an embodiment, the start point corresponding to the widest width is set equal to 0.3 Vdd.

The reason underlying such selection of the start points in steps 1910 and 1920 may be appreciated by noting that a failure result requires certain energy level (proportionate to area, which can be computed by multiplying of height and width) of the input glitch, and thus a higher height is chosen for narrow width and lower height is chosen for wider widths.

In steps 1930 and 1940, the NP curves corresponding to the narrower width and widest width are respectively determined. The determination may be performed as described above with reference to FIG. 18. NP curves 2001 and 2003 are respectively generated as a result.

Figure 20:
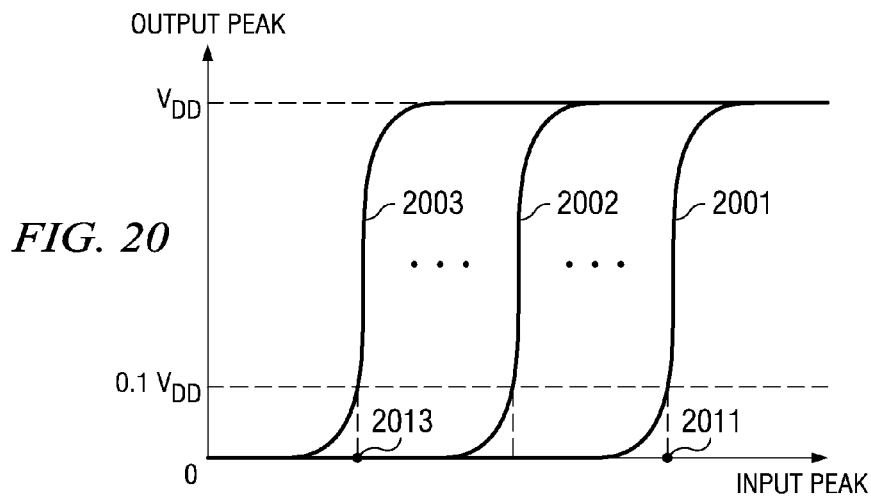
FIG. 20 depicts first three NP curves corresponding to narrowest width, widest width and intermediate (middle) width.

In step 1950, a first value is set equal to the input peak causing a failure result (in noise immunity characterization) from NP curve corresponding to the narrower width. With reference to FIG. 20, the first value equals the input peak at point 2011, corresponding to an output peak equaling the threshold value of (0.1*Vdd).

In step 1960, a second value is set equal to input peak causing a failure result from NP curve corresponding to the wider width. The second value equals the input peak at point 2013 in FIG. 20. It may be noted that the input peaks of steps 1950 and 1960 may be determined accurately for noise immunity analysis, and such accurate values may be advantageously used, as will be clearer from the description below with reference to FIG. 22.

In step 1970, the start point for the third NP curve 2002 (corresponding to the middle width) is set equal to the average of the first value and the second value. In step 1980, the NP curve is determined for the middle width, as described above with reference to FIG. 18. The method then ends in step 1999. The description is continued with reference to the manner in which the NP curves for other widths may be determined according to an aspect of the present invention.

VII.D. Determining Start Point for the Remaining NP Curves

Figure 21:
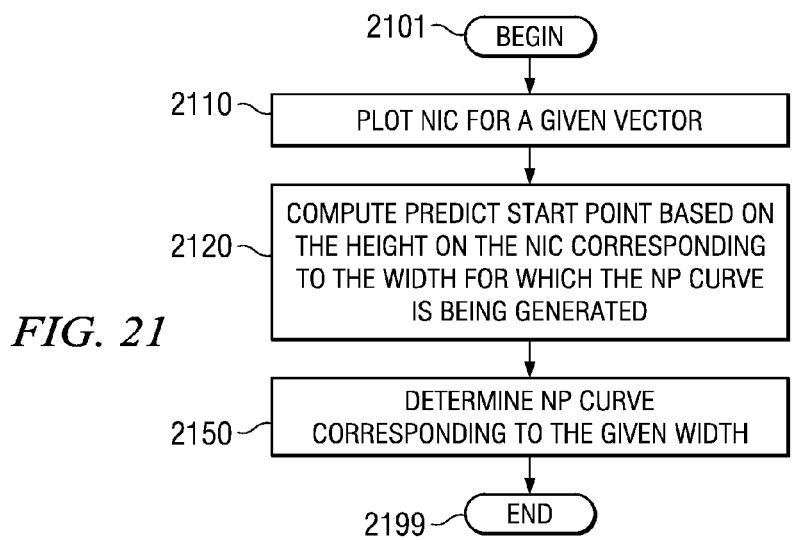
FIG. 21 is a flowchart illustrating the manner in which the start point may be placed in the transition region for the remaining (after first three) NP curves according to an aspect of the present invention.

FIG. 21 is a flowchart illustrating the manner in which the start point may be placed in the transition region for the remaining (after first three) NP curves according to an aspect of the present invention. The flowchart is described with reference to FIG. 12. The flowchart starts in step 2101 in which control immediately passes to step 2110.

In step 2110, a noise immunity curve is plotted for a given vector. Some of the immunity transition point may be determined accurately as described in sections above and the other portion of the curve may be generated by the curve fitting techniques noted above.

In step 2120, the start point is predicted based on the height on the NIC corresponding to the width for which the NP curve is being generated. For example, assuming that a NP curve is being determined between NP curves 2001 and 2002, that the corresponding immunity transition points respectively equal 1201 and 1202, and that the NP curve sought to be determined corresponds to a width (X-axis of FIG. 12) of immunity transition point 1204, the start point would be set equal to Y-coordinate of point 1204.

In step 2150, the NP curve is determined corresponding to the given width using the approaches described above with respect to FIG. 18. The method ends in step 2199.

The description is continued with reference to a broad approach which takes advantage of various techniques described above to further reduce the computational requirements.

VIII. Determining NP Curves and NIC Together

Figure 22:
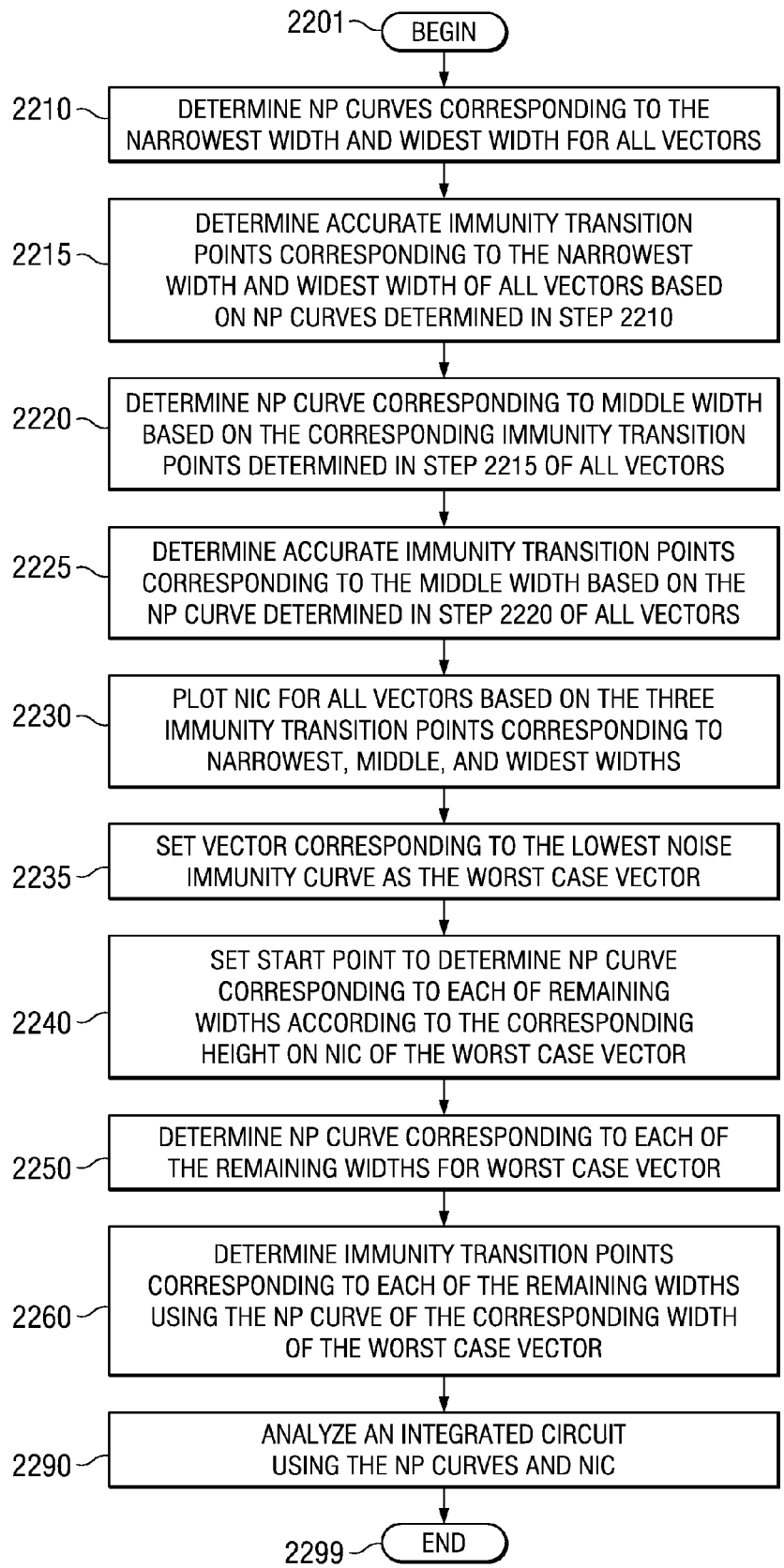
FIG. 22 is a flowchart illustrating the manner in which the NP curves and the NICs may be determined in an interleaved manner to reduce computational requirements according to an aspect of the present invention.

Several aspects of the present invention reduce computational requirements in characterizing NP data by using data available from the NICs, and also in characterizing NICs by using NP data as described now. FIG. 22 is a flowchart illustrating the manner in which the NP curves and the NICs may be determined together according to an aspect of the present invention. The flowchart starts in step 2201 in which control immediately passes to step 2210.

In step 2210, the NP curves corresponding to the narrowest width and widest width for all vectors are determined. The approaches described above with reference to FIGS. 18, 19 and 20 may be used to determine the curves for each vector.

In step 2215, the accurate immunity transition points corresponding to the narrowest width and widest width may be determined for all vectors based on NP curves determined in step 2210. The approach described above with respect to FIG. 13B may be used to determine a narrow search range using the data available from step 2210, and the approach described with reference to FIG. 11 may be used to determine the specific accurate immunity transition point within the search range. Due to the use of the information available from step 2210, the accurate immunity transition points may be determined and computational requirements are reduced in step 2215.

In step 2220, the NP curve corresponding to middle width is determined based on the corresponding immunity transition points determined in step 2215 of all vectors. The approaches described above with reference to FIGS. 18, 19 and 20 may be used to determine the curve for each vector.

In step 2225, the accurate immunity transition point corresponding to the middle width may be determined based on the NP curve determined in step 2220 for all vectors. The approaches described above with respect to FIGS. 13B and 11 may be used to determine the accurate immunity transition point similar to step 2215.

In step 2230, the (approximate) NIC is determined for all the vectors based on the three immunity transition points corresponding to narrowest, middle and widest widths using techniques such as curve fitting as noted above. In step 2235, the vector corresponding to the lowest noise immunity curve is set as the worst case vector. Due to the use of the data corresponding to only the worst case vector, computations are avoided for other vectors to at least to some degree. The remaining steps of FIG. 22 are performed only on worst case vector.

In step 2240, the start point corresponding to each of remaining widths is determined according to the corresponding height on NIC. Due to the use of the data from NIC (for the worst case vector in the described embodiment), the start point may be quickly placed in the transition region, thereby reducing the computational requirements.

In step 2250, the NP curve corresponding to each of the remaining width is determined using the start point determined in step 2240. The determination may be performed using the approaches of FIG. 18. Due to setting of output peaks to Vdd or 0 corresponding to all the input glitches that cause Vdd or 0 in the output peak, computational requirements are reduced.

In step 2260, the immunity transition points corresponding to each of the remaining widths are determined using the NP curve of the corresponding width of the worst case vector. The determination may be performed using the approaches of FIG. 15. Due to the narrow search range obtained as described above with reference to FIG. 15, computational requirements are also reduced accordingly.

In step 2290, an integrated circuit is analyzed using the NP curves and NICs. The flowchart ends in step 2299. From the above, it may be appreciated that the computational requirements are reduced by several techniques. The description is continued with respect to reducing computational requirements in the characterization of sequential elements.

IX. Sequential Elements

IX.A. General Introduction

Noise immunity analysis often needs to be performed for various heights and widths of input glitches applied to the input pins of sequential cells. A noise immunity curve (NIC) for sequential cells needs to indicate the minimum height of an input glitch (of a specific width) which would cause a failure, i.e., generate an output glitch of a pre-specified height (e.g., 10% of Vdd) for any timing of a clock signal (that would determine the time instance at which the sequential element would change state). Such an output glitch would be generated when the setup and hold times are met with the relative timing of the input glitch and the clock signal. Thus, noise immunity analysis is performed on pins that are constrained by a clock signal, for example, data pin.

Figure 23:
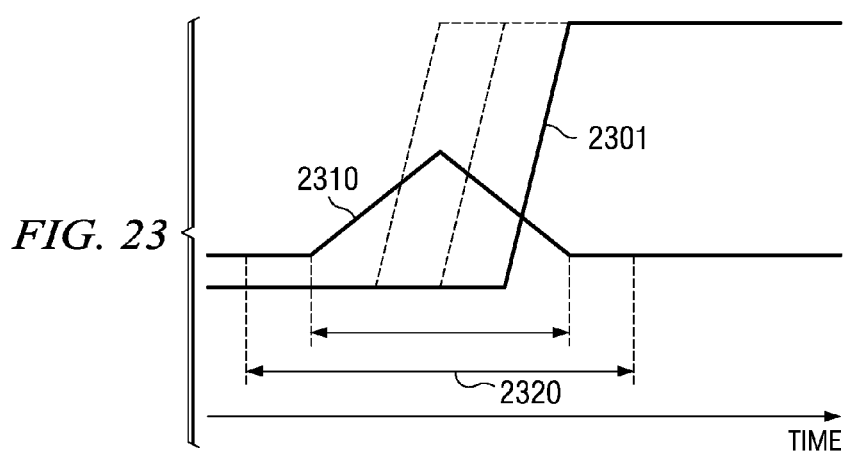
FIG. 23 is a timing diagram illustrating the general consideration in noise immunity characterization for sequential elements.

Thus, for input glitch 2310 of FIG. 23 with a specific height and width, the clock transition point 2301 is varied to various points of interest to generate corresponding clock signals, shown as dotted lines. The transition point is varied in sweep region 2320, which extends by a negative setup time ahead of the expected start time of input glitch 2310 and by a negative hold time after the expected end of the input glitch 2310. Generating such multiple clock signals is referred to as 'clock sweeping'.

In one prior embodiment, the clock sweeping is performed for each combination of height and width of interest. Such an approach may require a large number of simulations, and thus computation resources. For example, for an input noise glitch of width 1000 PS of height assuming negative setup and negative hold margin of 20% each, total width for which clock sweeping will be required =1400 PS. If clock is swept at the step of 10 PS, then total number of spice simulations equals 140. Thus 140 spice simulations may be performed for each combination of height and width of interest. The number of combinations of interest may be reduced by employing binary search type techniques within the 0 to 2*Vdd range.

Various aspects of the present invention reduce the number of simulations further as described below.

IX.B. Avoiding Sweeps

Figure 24:
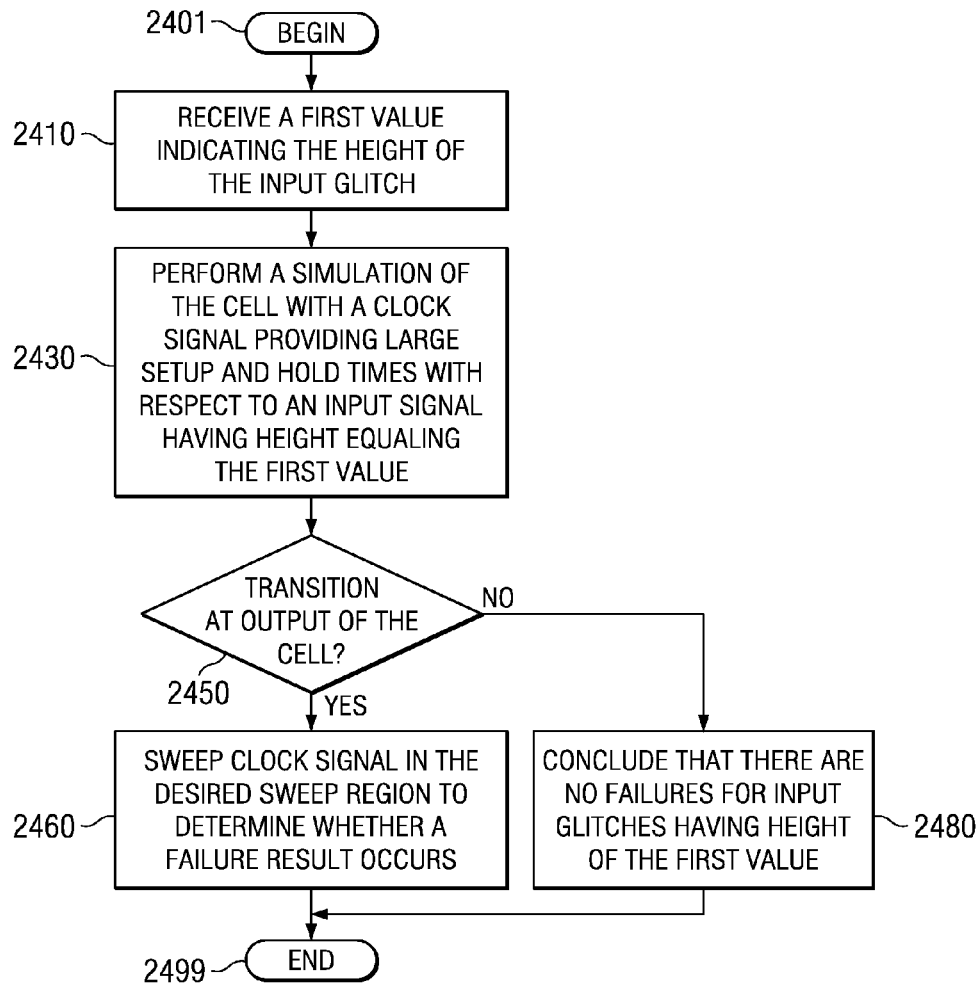
FIG. 24 is a flowchart illustrating the manner in which sweeps can be avoided for some heights of input glitches according to an aspect of the present invention.

FIG. 24 is a flowchart illustrating the manner in which sweeps can be avoided for some heights of input glitches according to an aspect of the present invention. The flowchart is described with reference to FIG. 25. The flowchart starts in step 2401 in which control immediately passes to step 2410.

In step 2410, a first value indicating the height of an input glitch is received. In step 2430, a simulation is performed on the (design of) cell with a clock signal providing large setup and hold times with respect to an input transition waveform having height equaling the first value. The large setup and hold times are often referred to as infinite setup and hold times. In general, the length/duration of setup and hold times are chosen to ensure that the propagation of input glitch to the output is not limited by setup and hold time considerations as described below with reference to FIG. 25.

Figure 25:
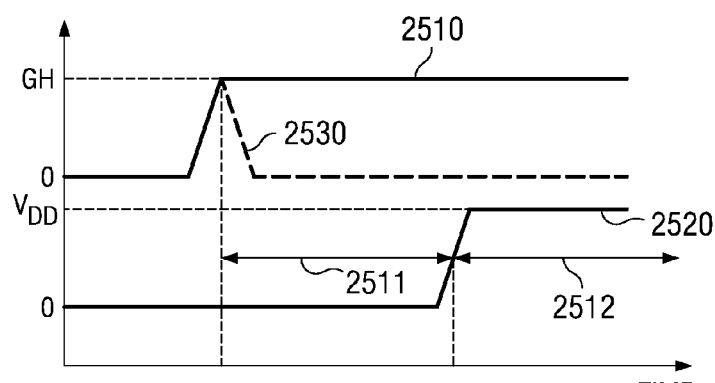
FIG. 25 is a timing diagram depicting input glitch and a clock signal with large setup and hold times in an embodiment of the present invention.

FIG. 25 is a timing diagram illustrating the manner in which step 2430 may be performed. As shown there, input transition waveform 2510 is held at the height of the input glitch (Gh) for a long duration such that both setup time 2511 and hold time 2512 are substantially high/infinite (with reference to clock signal 2520). The height of input transition waveform 2510 equals the height of input glitch 2530, shown as dotted line to the extent there is no overlap with input transition waveform 2510. Due to the high values of setup time and hold time, the latching of high level of input transition waveform 2510 is not limited by setup time and hold time considerations.

Continuing with reference to FIG. 24, in step 2450, a determination is made as to whether a transition occurs at the output for the simulation of the input glitch. Control passes to step 2460 if a transition occurs and to step 2480 otherwise.

In step 2460, the clock signal is swept in the desired sweep region to determine whether a failure result occurs in at least one of the simulations. As with noise immunity analysis described above for combinatorial cells, a failure result is deemed to be obtained if the height of the output glitch exceeds 10% of Vdd (supply voltage/maximum height of the output glitch). Otherwise, a success result is deemed to be obtained. The sweeping may be stopped upon the occurrence of first failure result. Control then passes to step 2499, including in situations when no failure results are obtained.

In step 2480, it is concluded that input glitches having height of the first value (are not harmful) would not effect the cell. It may be inferred that the input glitches having the height of the first value with any width are also not harmful and can be ignored for performing simulation. Control passes to step 2499, in which the method ends.

Thus, by using an extra simulation, sweeping (140 simulations in the above example) may be avoided for each width of the input glitch having a height of the first value, thereby reducing the computational requirements. The description is continued with respect to the manner in which noise immunity characterization can be performed for sequential elements according to various aspects of the present invention.

IX.C. Noise Immunity Characterization for Sequential Elements

Figure 26:
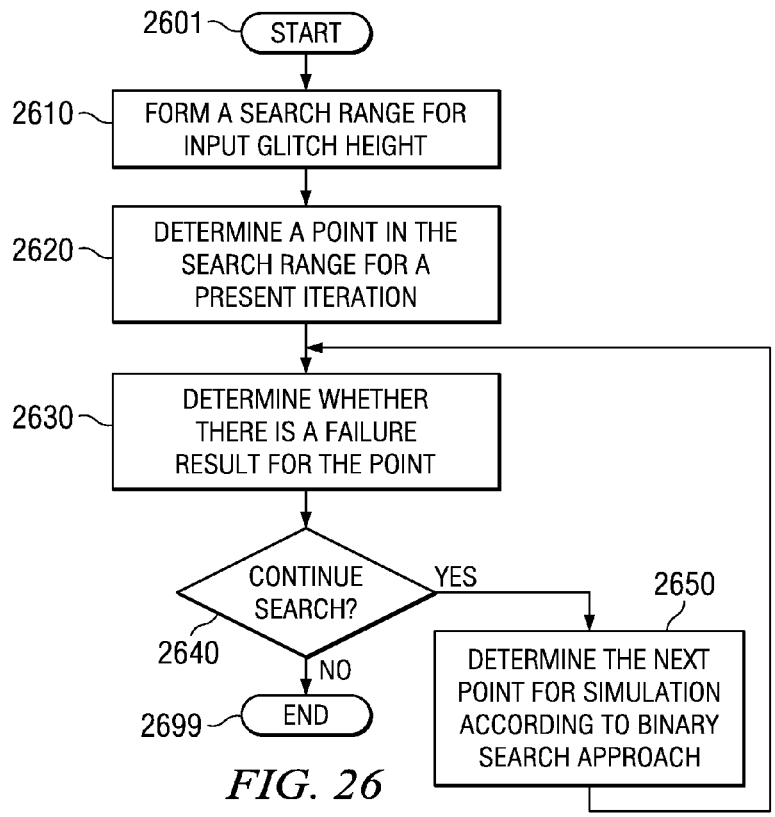
FIG. 26 is a flowchart illustrating the manner in which noise immunity curves can be generated for sequential elements according to an aspect of the present invention.

FIG. 26 is a flowchart illustrating the manner in which noise immunity curves can be generated (for a specific width of input glitch) for sequential elements according to an aspect of the present invention. The flowchart starts in step 2601 in which control immediately passes to step 2610.

In step 2610, a search range is formed for a height of an input glitch. The search range may be formed based on the techniques described above with reference to FIGS. 11 and 14A. In step 2620, a point in the search range for a present iteration is determined. Assuming binary search techniques are used, the middle point between an upper bound and lower bound of the search range is set as the point.

In step 2630, a determination is made as to whether there is a failure result for the point. The approach of FIGS. 24 and 25 can be used to make such a determination described, such a determination can be potentially made with one simulation.

In step 2640 a determination is made whether to continue the search. In general, once the point with a failure result is determined with a desired resolution/accuracy, the search can be terminated. Control passes to step 2650 if the search is to be continued and to step 2699 otherwise. In step 2650, the next point for simulation is determined according to binary search approach and control passes to step 2630. The method ends in step 2699.

By using narrow search ranges in step 2610 (in addition to the techniques of FIGS. 24 and 25), the computational requirements in generating NIC may be reduced. The description is continued with respect to embodiments of digital processing system implemented substantially in the form of software.

X. Software Implementation

Figure 27:
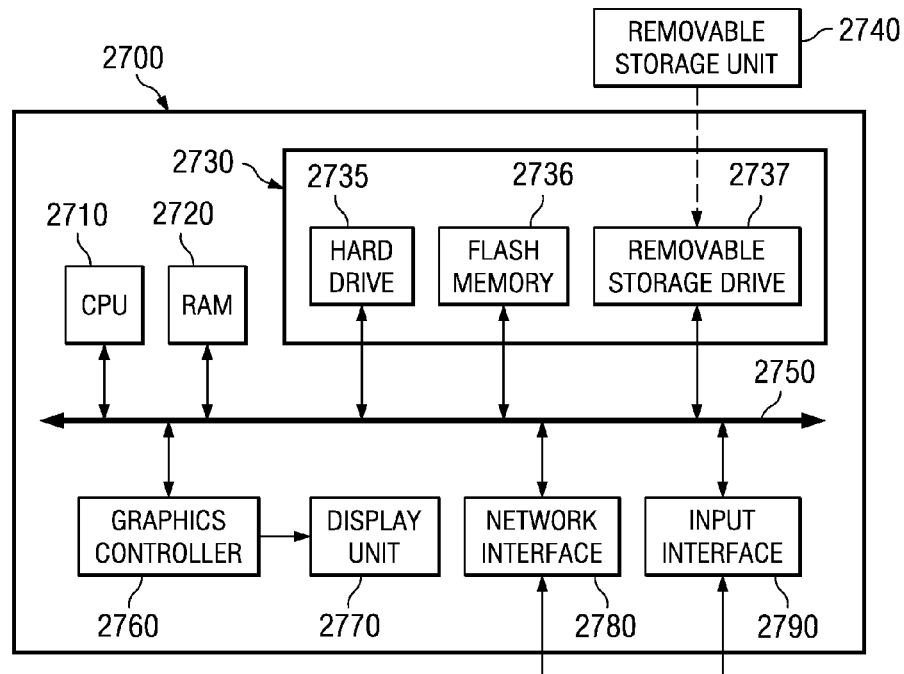
FIG. 27 is a block diagram illustrating the details of a digital processing system implemented substantially in the form of software in an embodiment of the present invention.

FIG. 27 is a block diagram illustrating the details of digital processing system 2700 implemented substantially in the form of software in an embodiment of the present invention. System 2700 may contain one or more processors such as central processing unit (CPU) 2710, random access memory (RAM) 2720, secondary memory 2730, graphics controller 2760, display unit 2770, network interface 2780, and input interface 2790. All the components except display unit 2770 may communicate with each other over communication path 2750, which may contain several buses as is well known in the relevant arts. The components of FIG. 27 are described below in further detail.

CPU 2710 may execute instructions stored in RAM 2720 to provide several features of the present invention. CPU 2710 may contain multiple processing units, with each processing unit potentially being designed for a specific task. Alternatively, CPU 2710 may contain only a single processing unit. RAM 2720 may receive instructions from secondary memory 2730 using communication path 2750.

Graphics controller 2760 generates display signals (e.g., in RGB format) to display unit 570 based on data/instructions received from CPU 2710. Display unit 2770 contains a display screen to display the images defined by the display signals. Input interface 2790 may correspond to a key_board and/or mouse, and generally enables a user to provide inputs. Network interface 2780 enables some of the inputs (and outputs) to be provided on a network. In general, display unit 2770, input interface 2790 and network interface 2780 enable a user to check the status of various characterization tasks, and to perform chip-level analysis of integrated circuits.

Secondary memory 2730 may contain hard drive 2735, flash memory 2736 and removable storage drive 2737. Secondary memory 2730 may store the data and software instructions (e.g., to characterize a parameter), which enable system 2700 to provide several features in accordance with the present invention. Some or all of the data and instructions may be provided on removable storage unit 2740, and the data and instructions may be read and provided by removable storage drive 2737 to CPU 2710. Floppy drive, magnetic tape drive, CD_ROM drive, DVD Drive, Flash memory, removable memory chip (PCMCIA Card, EPROM) are examples of such removable storage drive 2737.

Removable storage unit 2740 may be implemented using medium and storage format compatible with removable storage drive 2737 such that removable storage drive 2737 can read the data and instructions. Thus, removable storage unit 2740 includes a computer readable storage medium having stored therein computer software and/or data.

In this document, the term "computer program product" is used to generally refer to removable storage unit 2740 or hard disk installed in hard drive 2735. These computer program products are means for providing software to system 2700. CPU 2710 may retrieve the software instructions, and execute the instructions to provide various features of the present invention as described above.

XI. CONCLUSION

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

The invention claimed is:

1. A method of reducing computational resources in characterizing a parameter for a combination of an input pin and an output pin of a cell, said cell being contained in a library used in the design of an integrated circuit, said method comprises:

determining a worst case vector, wherein said worst case vector represents a set of input bits, with each of said input bits being applied to a corresponding one of a set of input pins wherein the corresponding one is other than said input pin of said combination, wherein said worst case vector would cause propagation of most noise from said input pin to said output pin among vectors which would cause a bit value transition on said output pin if the input bit value is changed on said input pin;

computing a plurality of data values for said parameter when said worst case vector is applied to said set of input pins, wherein said plurality of data values are used in an analysis of said integrated circuit irrespective of which of said vectors is applied to said set of input pins; and wherein said parameter comprises noise immunity, wherein a failure result is deemed to be obtained for an input glitch of a first height and a first width if the height of an output glitch corresponding to said input glitch exceeds a first threshold voltage, and a success result is deemed to be obtained otherwise, said method further comprises generating a noise immunity curve (NIC) corresponding to only said worst case vector, wherein said NIC contains a plurality of immunity transition points, wherein each of said plurality of immunity transition points indicates a minimum value for one dimension of said input glitch required for said failure result for each of a value of the other dimension.

2. The method of claim 1, wherein said one dimension comprises height and said other dimension comprises width.

3. The method of claim 1, wherein said parameter also comprises noise propagation (NP), said method further comprising generating a NP curve corresponding to each width of interest, wherein said NP curve indicates a height of an output glitch in response to an input glitch of a given height, wherein said NP curves are also generated only for said worst case vector.

4. The method of claim 3, wherein data representing said NP curves are used to generate said NIC and said NIC is used to generate said NP curves.

5. The method of claim 3, wherein each of said plurality of immunity transition points is determined by a search in a search range, wherein said search range is less than a maximum height possible for said height of said input glitch.

6. The method of claim 5, further comprising:
plotting said NIC based on a plurality of computed immunity transition points;
predicting a potential immunity transition point for a width of an immunity transition point sought to be computed by using said NIC; and
setting said search range based on a value of height of said potential immunity transition point.

7. The method of claim 5, further comprises:
determining a first NP curve corresponding to a width of a first immunity transition point sought to be determined on said NIC;
setting an upper bound and a lower bound of said search range according to said first NP curve.

8. The method of claim 7, wherein said setting finds a first point on said first NP curve with a height of the input glitch exceeding the height of said first immunity transition point, and a second point on said NP curve with a height of the input glitch less than the height of said first immunity transition point, wherein said upper bound and said lower bound of said search range are respectively set equal to the height of the input glitches corresponding to said first point and said second point.

9. The method of claim 5, further comprising:
setting an upper bound of said search range to the height of a fourth point on said NIC and the lower bound of said search range to the height of a fifth point on said NIC, wherein said fourth point and said fifth point correspond to immunity transition points already determined, said fifth point having a height less than the height of a first immunity transition point sought to be determined on said NIC, said fourth point having a height more than the height of a first immunity transition point sought to be determined on said NIC.

10. The method of claim 3, further comprising:
determining a transition region of a first NP curve sought to be plotted for said cell;
determining a first input glitch height corresponding to one boundary of said transition region on said first NP curve and a second input glitch height corresponding to another boundary of said transition region wherein said second input glitch height is greater than said first input glitch height;
setting the output glitch height corresponding to each point on said first NP curve with an input glitch height greater than the input glitch height of said second input glitch height to equal the output glitch height of said second input glitch height; and
setting the output glitch height corresponding to each point on said first NP curve with an input glitch height less than the input glitch height of said first input glitch height to equal the output glitch height of said first input glitch height.

11. The method of claim 10, wherein said determining said transition region comprises:
predicting a start point according to the width for which said NP curve is being plotted, wherein said predicting maps the width of said NP curve to a first point on said NIC, wherein said start point is set based on the input glitch height of said first point on said NIC.

12. The method of claim 11, wherein a first start NP curve and a second start NP curve are determined before other NP curves, wherein said first start NP curve corresponds to the narrowest width and said second start NP curve corresponds to the widest width, said method further comprising:
setting said start point for said first start NP curve to equal a first start value and said start point for said second NP curve to a second start value, wherein said first start value is greater than said second start value.

13. The method of claim 12, wherein said first start value is closer to a maximum possible height of the input glitch and said second start value is closer to a minimum possible height of the input glitch.

14. A machine readable medium carrying one or more sequences of instructions for causing a system to reduce computational resources in characterizing a parameter for a combination of an input pin and an output pin of a cell, said cell being contained in a library used in the design of an integrated circuit, wherein execution of said one or more sequences of instructions by one or more processors contained in said system causes said one or more processors to perform the actions of:
determining a worst case vector, wherein said worst case vector represents a set of input bits, with each of said input bits being applied to a corresponding one of a set of input pins wherein the corresponding one is other than said input pin of said combination, wherein said worst case vector would cause propagation of most noise from said input pin to said output pin among vectors which would cause a bit value transition on said output pin if the input bit value is changed on said input pin;
computing a plurality of data values for said parameter when said worst case vector is applied to said set of input pins,
wherein said plurality of data values are used in an analysis of said integrated circuit irrespective of which of said vectors is applied to said set of input pins; and
wherein said parameter comprises noise immunity, wherein a failure result is deemed to be obtained for an input glitch of a first height and a first width if the height of an output glitch corresponding to said input glitch exceeds a first threshold voltage, and a success result is deemed to be obtained otherwise, said method further comprises generating a noise immunity curve (NIC) corresponding to only said worst case vector, wherein said NIC contains a plurality of immunity transition points, wherein each of said plurality of immunity transition points indicates a minimum value for one dimension of said input glitch required for said failure result for each of a value of the other dimension.

15. The machine readable medium of claim 14, wherein said one dimension comprises height and said other dimension comprises width.

16. The machine readable medium of claim 15, wherein said parameter also comprises noise propagation (NP), said method further comprising generating a NP curve corresponding to each width of interest, wherein said NP curve indicates a height of an output glitch in response to an input glitch of a given height, wherein said NP curves are also generated only for said worst case vector.

17. The machine readable medium of claim 16, wherein data representing said NP curves are used to generate said NIC and said NIC is used to generate said NP curves.

18. The machine readable medium of claim 16, wherein each of said plurality of immunity transition points is determined by a search in a search range, wherein said search range is less than a maximum height possible for said height of said input glitch.

19. The machine readable medium of claim 18, further comprising:
- plotting said NIC based on a plurality of computed immunity transition points;
- predicting a potential immunity transition point for a width of an immunity transition point sought to be computed by using said NIC; and
- setting said search range based on a value of height of said potential immunity transition point.

20. The machine readable medium of claim 18, farther comprises:
- determining a first NP curve corresponding to a width of a first immunity transition point sought to be determined on said NIC;
- setting an upper bound and a lower bound of said search range according to said first NP curve.

21. The machine readable medium of claim 20, wherein said setting finds a first point on said first NP curve with a height of the input glitch exceeding the height of said first immunity transition point, and a second point on said NP curve with a height of the input glitch less than the height of said first immunity transition point, wherein said upper bound and said lower bound of said search range are respectively set equal to the height of the input glitches corresponding to said first point and said second point.

22. The machine readable medium of claim 18, further comprising:
- setting an upper bound of said search range to the height of a fourth point on said NIC and the lower bound of said search range to the height of a fifth point on said NIC, wherein said fourth point and said fifth point correspond to immunity transition points already determined, said fifth point having a height less than the height of a first immunity transition point sought to be determined on said NIC, said fourth point having a height more than the height of a first immunity transition point sought to be determined on said NIC.

23. The machine readable medium of claim 16, further comprising:
- determining a transition region of a first NP curve sought to be plotted for said cell;
- determining a first input glitch height corresponding to one boundary of said transition region on said first NP curve and a second input glitch height corresponding to another boundary of said transition region wherein said second input glitch height is greater than said first input glitch height;
- setting the output glitch height corresponding to each point on said first NP curve with an input glitch height greater than the input glitch height of said second input glitch height to equal the output glitch height of said second input glitch height; and
- setting the output glitch height corresponding to each point on said first NP curve with an input glitch height less than the input glitch height of said first input glitch height to equal the output glitch height of said first input glitch height.

24. The machine readable medium of claim 23, wherein said determining said transition region comprises:
- predicting a start point according to the width for which said NP curve is being plotted, wherein said predicting maps the width of said NP curve to a first point on said NIC, wherein said start point is set based on the input glitch height of said first point on said NIC.

25. The machine readable medium of claim 24, wherein a first start NP curve and a second start NP curve are determined before other NP curves, wherein said first start NP curve corresponds to the narrowest width and said second start NP curve corresponds to the widest width, further comprising:
- setting said start point for said first start NP curve to equal a first start value and said start point for said second NP curve to a second start value, wherein said first start value is greater than said second start value.

26. The machine readable medium of claim 25, wherein said first start value is closer to a maximum possible height of the input glitch and said second start value is closer to a minimum possible height of the input glitch.

* * * * *